(12) United States Patent
Fujiwara

(10) Patent No.: US 9,419,600 B2
(45) Date of Patent: Aug. 16, 2016

(54) PWM SIGNAL GENERATION CIRCUIT AND PROCESSOR SYSTEM

(71) Applicant: Renesas Electronics Corporation, Kanagawa (JP)

(72) Inventor: Yasuyuki Fujiwara, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/564,801

(22) Filed: Dec. 9, 2014

(65) Prior Publication Data

US 2015/0145574 A1    May 28, 2015

Related U.S. Application Data

(63) Continuation of application No. 14/006,622, filed as application No. PCT/JP2012/001287 on Feb. 24, 2012, now Pat. No. 8,947,145.

(30) Foreign Application Priority Data

Mar. 28, 2011    (JP) ................................. 2011-070437

(51) Int. Cl.

| | |
|---|---|
| *H03K 3/017* | (2006.01) |
| *H03K 7/08* | (2006.01) |
| *H02M 1/08* | (2006.01) |
| *H05B 33/08* | (2006.01) |
| *H02M 1/00* | (2006.01) |
| *H02M 3/156* | (2006.01) |

(52) U.S. Cl.
CPC . *H03K 7/08* (2013.01); *H02M 1/08* (2013.01); *H05B 33/0806* (2013.01); *H02M 3/156* (2013.01); *H02M 2001/0003* (2013.01)

(58) Field of Classification Search
None
See application file for complete search history.

(56) References Cited

U.S. PATENT DOCUMENTS

| 6,377,480 B1 | 4/2002 | Sase et al. |
|---|---|---|
| 7,017,069 B2 | 3/2006 | Kudo et al. |

(Continued)

FOREIGN PATENT DOCUMENTS

| JP | 05-161262 A | 6/1993 |
|---|---|---|
| JP | 09-074737 A | 3/1997 |

(Continued)

OTHER PUBLICATIONS

International Search Report of PCT/JP2012/001287 dated Apr. 17, 2012.

(Continued)

*Primary Examiner* — Cassandra Cox
(74) *Attorney, Agent, or Firm* — Sughrue Mion, PLLC

(57) ABSTRACT

A PWM signal generation circuit according to the present invention includes a duty setting unit (10) configured to generate a duty control signal designating a duty ratio corresponding to each period of a PWM signal on the basis of an initial duty setting signal, a target duty setting signal, a slope setting signal, and a clock signal, a period setting unit (20) configured to output a period setting value, and an output control unit (30) configured to generate the PWM signal having a period corresponding to the period setting value and having a duty ratio corresponding to a value of the duty control signal. The duty setting unit (10) increases the value of the initial duty ratio to the value of the target duty ratio each time the number of a clock pulse of the clock signal reaches the period setting value reaches the slope setting value.

21 Claims, 16 Drawing Sheets

(56) References Cited

U.S. PATENT DOCUMENTS

| | | |
|---|---|---|
| 7,791,386 B2 | 9/2010 | Kris |
| 2006/0125539 A1* | 6/2006 | Yoshikawa .............. G06F 1/025 327/172 |
| 2009/0184662 A1 | 7/2009 | Given et al. |
| 2010/0091530 A1 | 4/2010 | Yoshida et al. |
| 2010/0253240 A1 | 10/2010 | Inamori |

FOREIGN PATENT DOCUMENTS

| | | |
|---|---|---|
| JP | 2002-218737 A | 8/2002 |
| JP | 2004-159473 A | 6/2004 |
| JP | 2004-297985 A | 10/2004 |
| JP | 2006-25497 A | 1/2006 |
| JP | 2009-112168 A | 5/2009 |
| WO | 2008/041666 A1 | 4/2008 |

OTHER PUBLICATIONS

Communication dated Jan. 27, 2015 from the Korean Intellectual Property Office in counterpart application No. 10-2013-7025655.

Communication dated Jun. 17, 2015, issued by the State Intellectual Property Office of the People's Republic of China in corresponding Chinese Application No. 201280016973.3.

* cited by examiner

PWM SIGNAL GENERATION CIRCUIT AND PROCESSOR SYSTEM

CROSS-REFERENCE TO RELATED APPLICATIONS

This application is a Continuation Application of U.S. application Ser. No. 14/006,622 filed Sep. 20, 2013, which is a 371 of International Application No. PCT/JP2012/001287, filed Feb. 24, 2012, claiming priority based on Japanese Patent Application No. JP2011-070437, filed Mar. 28, 2011, the contents of all of which are incorporated herein by reference in their entirety.

TECHNICAL FIELD

The present invention relates to a PWM signal generation circuit and processor system and in particular to a PWM signal generation circuit and processor system that have a soft start function of gradually increasing the duty of a PWM signal.

BACKGROUND ART

Various types of circuits have often used pulse width modulation (PWM) signals in recent years. For example, a switching power supply circuit performs a switching operation using a PWM signal. At this time, the switching power supply circuit can control the voltage level of an output voltage generated thereby by changing the pulse width of the PWM signal. In using the PWM signal, the switching power supply circuit can shape the rising waveform of the output voltage by performing soft-start control to set the initial duty ratio of the PWM signal to a small value and then increasing the duty ratio with a lapse of time.

There have been proposed many such PWM signal generation circuits, which generate a PWM signal using soft-start control. Patent Literature 1 discloses an example of such a PWM signal generation circuit. A method for soft-starting a switching power supply disclosed in Patent Literature 1 includes gradually increasing the duty ratio of a PWM signal to be generated while monitoring the voltage level of an output voltage VOUT of the switching power supply circuit. However, the method for soft-starting a switching power supply disclosed in Patent Literature 1 involves always calculating the difference between a reference voltage Vref and the output voltage VOUT. Accordingly, assuming that a processor calculates this difference through a computing process, the processor is disadvantageously required to have a high computing capacity.

In view of the foregoing, Patent Literatures 2 and 3 disclose PWM signal generation circuits that soft-start control a PWM signal without having to monitor the output voltage of the circuit to be controlled, such as a switching power supply circuit.

Patent Literature 2 generates a PWM signal by providing various setting signals to a logic circuit (FIGS. 1 to 3 of Patent Literature 2). At this time, Patent Literature 2 performs soft-start control using a circuit shown in FIG. 7 of Patent Literature 2. Immediately after starting operating, the circuit shown in FIG. 7 of Patent Literature 2 sets the output value of DFF5 to "0H" and sets a signal EN1 to "L." Since the output value is "0H" and a signal PM1ONS is "L", the output of a gate 612 is set to "H," and the output value "0H" of DFF5 is changed to "1H" and sent to CB15. Computation similar to that when the on width is "1H" is performed in the apparatus. While a signal PM1 is changed from "L" to "H," the signal EN1 is "L." Accordingly, the signal PWM1 is kept at "L" by a gate 205. Since the signal PM1ONS is "H" and the signal RDWN1 is "L," the output value of DFF5 is inputted to CB15 while remaining "0H." Subsequently, the register value of DFF5 is updated to "1H" through predetermined computation. The signal EN1 of an on width output control unit 61 is also changed to "H", so that a PWM signal is outputted.

Patent Literature 3 discloses a soft-start circuit of a switching power source. This switching power source includes a triangular wave generating circuit, an error amplifier, and a PWM comparator. Normally, the switching power source obtains PWM pulses by comparing a triangular wave amplitude output of the triangular wave generating circuit with an output voltage of the error amplifier serving as a reference (comparison) voltage by using the PWM comparator. The soft-start circuit of the switching power source includes a soft-start reference value setting part and a counting circuit. The soft-start reference value setting part includes resistance networks and switches and uses the same means as an upper/lower limit setting part that includes a network and switch for setting upper and lower limits of the amplitude of a triangular wave generated by the triangular wave generating circuit when power is turned on. The counting circuit counts cycles of a triangular wave generated by the triangular wave generating circuit to obtain any multiple lengths of soft-start time in order to switch among the switches.

CITATION LIST

Patent Literature

[Patent Literature 1] Japanese Unexamined Patent Application Publication No. 2004-297985
[Patent Literature 2] Japanese Unexamined Patent Application Publication No. 9-74737
[Patent Literature 3] Japanese Unexamined Patent Application Publication No. 2002-218737

SUMMARY OF INVENTION

Technical Problem

As described above, Patent Literatures 2 and 3 can soft-start control a PWM signal without having to monitor an output voltage of a switching power supply or the like. However, referring to FIG. 11 of Patent Literature 2 or FIG. 6 of Patent Literature 3, Patent Literatures 2 and 3 take predetermined time from the start of a PWM signal generation process until the actual output of the PWM signal (for example, the period until timing t4 in FIG. 11 of Patent Literature 2, a period tsoft1 in FIG. 6 of Patent Literature 3). That is, disadvantageously, Patent Literatures 2 and 3 cannot output a PWM signal immediately after starting generating the PWM signal nor optimally control the timing at which the destination circuit of the PWM signal moves from a stop state to an operation state (for example, there is a restriction on the timing at which the circuit moves to an operation state).

Solution to Problem

An aspect of the present invention is a PWM signal generation circuit for generating a PWM signal, including a duty setting unit configured to generate a duty control signal designating a duty ratio corresponding to each period of the PWM signal on the basis of an initial duty setting signal designating a value of an initial duty ratio of the PWM signal at the start of generation of the PWM signal, a target duty setting signal designating a value of a target duty ratio of the PWM signal, a slope setting signal designating a slope setting value designating the rate at which a duty ratio is changed from the initial duty ratio to the target duty ratio, and a clock signal, a period setting unit configured to output a period setting value indicating a length of one period of the PWM signal on the basis of a period setting signal, and an output control unit configured to generate the PWM signal having a period corresponding to the period setting value and having a duty ratio corresponding to a value of the duty control signal on the basis of the clock signal. The duty setting unit increases the value of the initial duty to the value of the target duty ratio each time the number of a clock pulse of the clock signal reaches the period setting value reaches the slope setting value.

An aspect of the present invention is A processor system for outputting a PWM signal to a circuit to be controlled which is disposed outside the processor system, including a memory MEM configured to store a program and a set value used in the processor system, a PWM signal generation unit, and a computing core. The PWM signal generation unit including a duty setting unit configured to generate a duty control signal designating a duty ratio corresponding to each period of the PWM signal on the basis of an initial duty setting signal designating a value of an initial duty ratio of the PWM signal at the start of generation of the PWM signal, a target duty setting signal designating a value of a target duty ratio of the PWM signal, a slope setting signal designating a slope setting value designating the rate at which a duty ratio is changed from the initial duty ratio to the target duty ratio, and a clock signal, a period setting unit configured to output a period setting value indicating a length of one period of the PWM signal on the basis of a period setting signal, and an output control unit configured to generate the PWM signal having a period corresponding to the period setting value and having a duty ratio corresponding to a value of the duty control signal on the basis of the clock signal. The duty setting unit increases the value of the initial duty to the value of the target duty ratio each time the number of a clock pulse of the clock signal reaches the period setting value reaches the slope setting value, and the computing core reads the program and the set value to generate the initial duty setting signal, the target duty setting signal, the slope setting signal, and the period setting signal, and provides the signals generated to the PWM signal generation unit.

A PWM signal generation circuit and processor system according to the present invention generate a PWM signal on the basis of an initial duty setting signal, a target duty setting signal, a slope setting signal, and a period setting signal each indicating a fixed value. Thus, the PWM signal generation circuit and processor system according to the present invention can generate a PWM signal even immediately after starting generating the PWM signal. Further, the PWM signal generation circuit and processor system according to the present invention generate a PWM signal on the basis of a clock signal. At this time, the PWM signal generation circuit and processor system according to the present invention update the value of the initial duty ratio on the basis of the clock signal. Thus, the PWM signal generation circuit and processor system according to the present invention can change the duty ratio with time to perform soft-start control, after starting generating a PWM signal.

Advantageous Effects of Invention

According to the PWM signal generation circuit and processor system according to the present invention, it is possible to output a soft-start-controlled PWM signal even immediately after starting the process of generating the PWM signal.

DESCRIPTION OF EMBODIMENTS

First Embodiment

Now, embodiments of the present invention will be described with reference to the drawings.

Before describing the embodiments of the present invention in detail, a processor system to which the present invention is applied will be outlined. While the present invention is applied to a processor system described below, the processor system is illustrative only and the present invention is also applicable to other processor systems.

Figure 1:
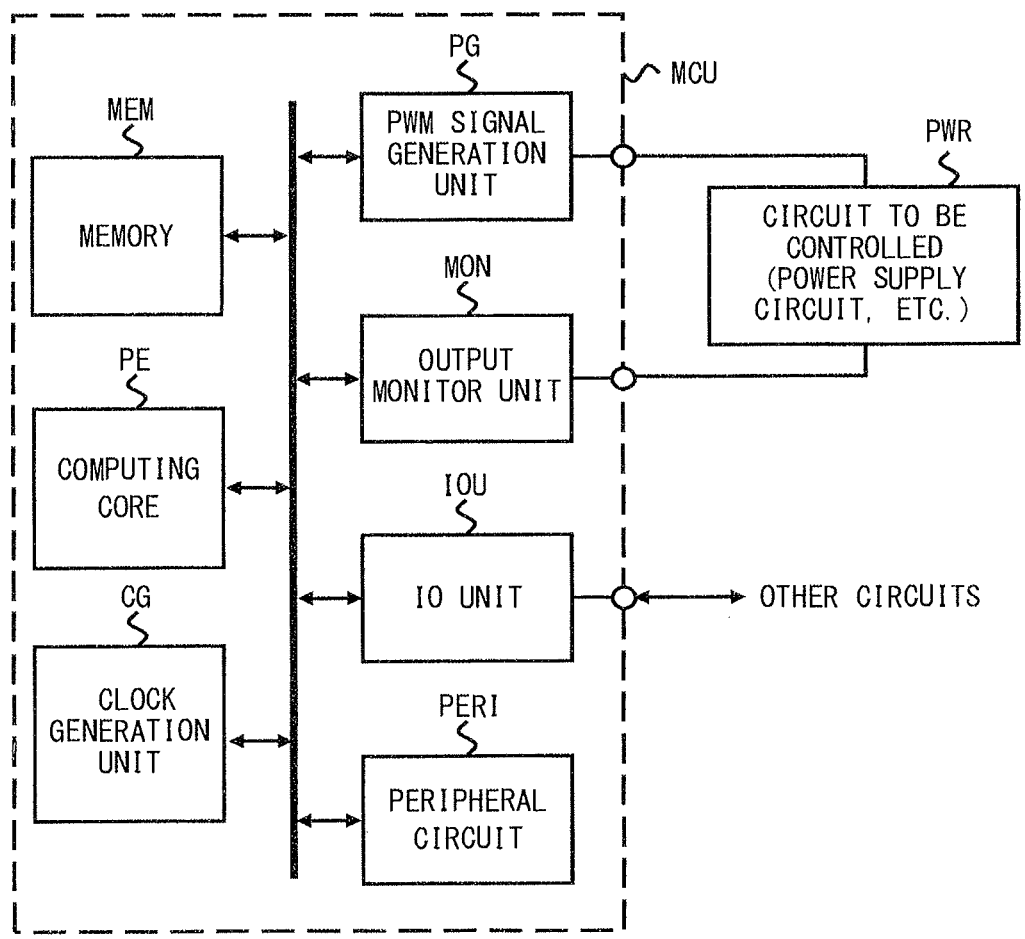
FIG. 1 is a block diagram of a processor system to which the present invention is applied.

FIG. 1 is a schematic diagram of a processor system MCU to which the present invention is applied. As shown in FIG. 1, the processor system MCU according to the present invention includes a memory MEM, a computing core PE, a clock generation unit CG, a PWM signal generation unit PG, an output monitor unit MON, an IO unit IOU, and a peripheral circuit PERI. Note that FIG. 1 shows a circuit PWR to be controlled which is controlled by the processor system MCU. The circuit PWR to be controlled is, for example, a power supply circuit that steps up or down a power supply voltage on the basis of a PWM signal generated by the PWM signal generation unit PG and then supplies the resulting voltage to another circuit.

The memory MEM stores a program used by the processor system MCU, set values used to run the processor system MCU, and the like. The computing core PE performs a specific process that the processor system MCU is required to perform, on the basis of the program stored in the memory MEM or a program read from the outside. The clock generation unit CG generates a clock signal used by the circuit blocks of the processor system MCU. The clock signal generated by the clock generation unit CG may be outputted to the outside. Note that the clock signal used in the processor system MCU may be provided by an external circuit.

The PWM signal generation unit PG generates a PWM signal to be outputted to the outside. The PWM signal generation unit PG may be achieved, for example, by using the timer function of the processor system MCU, or may be implemented as a function circuit different from the timer function.

The output monitor unit MON monitors the voltage of a node of an external circuit. The output monitor unit MON converts an analog voltage value into a digital value. The output monitor unit MON transmits the voltage level of a voltage value obtained from the outside, into the processor system MCU in the form of a digital value. In an example shown in FIG. 1, the output monitor unit MON monitors the output voltage of an power supply circuit disposed outside and can incorporate a digital value corresponding to the level of the output voltage into the processor system MCU. A circuit that can convert an analog value into a digital value, such as an analog-digital converter (ADC) or comparator circuit can serve as the output monitor unit MON.

The IO unit IOU communicates with external circuits, for example, receives a control signal or the like transmitted to the processor system MCU or transmits the result of a process performed by the processor system MCU. Conceivable specific examples of the IO unit IOU include an SPI unit and a UART unit. An SPI unit performs communications in accordance with the system packet interface (SPI) standard, which is three-wire or four-wire serial communication. A UART (universal asynchronous receiver transmitter) unit converts a start-stop synchronous serial signal into a parallel signal and vice versa.

The peripheral circuit PERI is a circuit other than the above-mentioned circuit blocks and includes a circuit block used by the computing core PE. Conceivable examples of the peripheral circuit PERI include a timer unit, a watchdog timer unit, a direct memory access (DMA) unit, a low-voltage detection unit, and a power-on reset (POR) unit.

The processor system MCU, to which the present invention is applied, has a configuration in which the computing core PE, the memory MEM, the PWM signal generation unit PG, the PWM signal generation unit PG, the output monitor unit MON, the IO unit IOU, and the peripheral circuit PERI are connected together via a bus. Although not shown, the processor system MCU receives power supply from another circuit. The processor system MCU described above shows an example processor system to which the present invention is applied. For example, the program and data stored in the memory MEM can be changed according to the system specification, as appropriate. Further, the circuit blocks may be connected together, for example, via multiple buses, or the peripheral circuit PERI and the other circuit blocks may be directly connected together without via the bus.

The processor system MCU can generate a PWM signal and provide it to the circuit PWR to be controlled. The processor system MCU also can control the duty of the PWM signal, the generation timing thereof, or the like using the voltage of a node of the circuit to be controlled, a control signal provided by another circuit, or the like. To clarify the usage of a PWM signal generated by the processor system MCU, a power supply circuit, which is an example of the circuit PWR to be controlled, will be described. While the power supply circuit described below drives a light emitting diode (LED) as a load circuit, the load circuit is not limited to an LED and may be a general-purpose circuit.

FIGS. 2A to 2D show examples of a power supply circuit that drives an LED. In FIGS. 2A to 2D, a power supply circuit is given reference sign PWR. While the power supply circuits PWR shown in FIGS. 2A to 2D each use an NMOS transistor as an output transistor that performs a switching operation, these power supply circuits may use a PMOS transistor, or a PNP transistor or NPN transistor as such an output transistor.

Figure 2A:
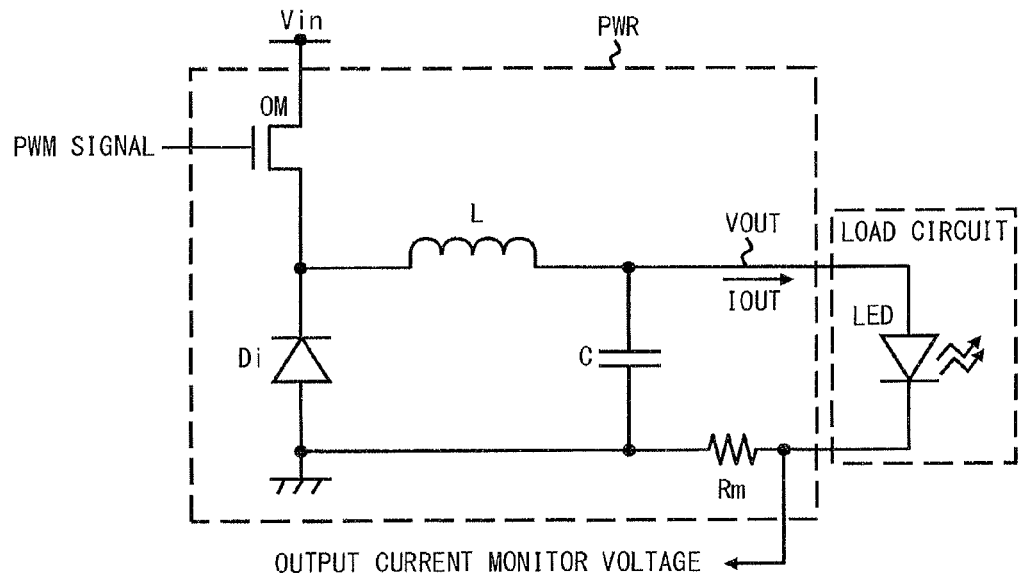
FIG. 2A is an example of a circuit diagram of a power supply circuit that is controlled by the processor system shown in FIG. 1.

The power supply circuit PWR shown in FIG. 2A is a step-down power supply circuit. The power supply circuit PWR includes an NMOS transistor OM, an inductor L, a diode Di, a capacitor C, and a resistor Rm. The drain of the NMOS transistor OM is connected to a power supply terminal which is given an input voltage Vin; the source thereof to the cathode of the diode Di. The NMOS transistor OM receives a PWM signal at the gate thereof and performs a switching operation in accordance with the voltage level of the PWM signal. The anode of the diode Di is connected to a ground terminal. Connected to a node between the source of the NMOS transistor OM and the cathode of the diode Di is one end of the inductor L. Connected between the other end of the inductor L and the ground terminal is the capacitor C. Generated at a node between one end of the capacitor C and the other end of the inductor L is an output voltage VOUT corresponding to the amount of charge accumulated in the capacitor C. Further, the charge accumulated in the capacitor C is provided to the LED in the form of an output current IOUT. Connected between the cathode of the LED and the ground terminal is the resistor Rm. The output current IOUT that has passed through the LED passes through the resistor Rm. That is, a voltage corresponding to the output current IOUT and the resistance of the resistor Rm occurs across the resistor Rm. This voltage serving as an output current monitor voltage is provided to the output monitor unit MON of the processor system MCU. The processor system MCU generates a PWM signal having a duty ratio or frequency such that the voltage level of the output current monitor voltage is fixed. That is, if the power supply circuit PWR shown in FIG. 2A is used, the processor system MCU and the power supply circuit PWR form a circuit that drives the LED using a constant current.

Figure 2B:
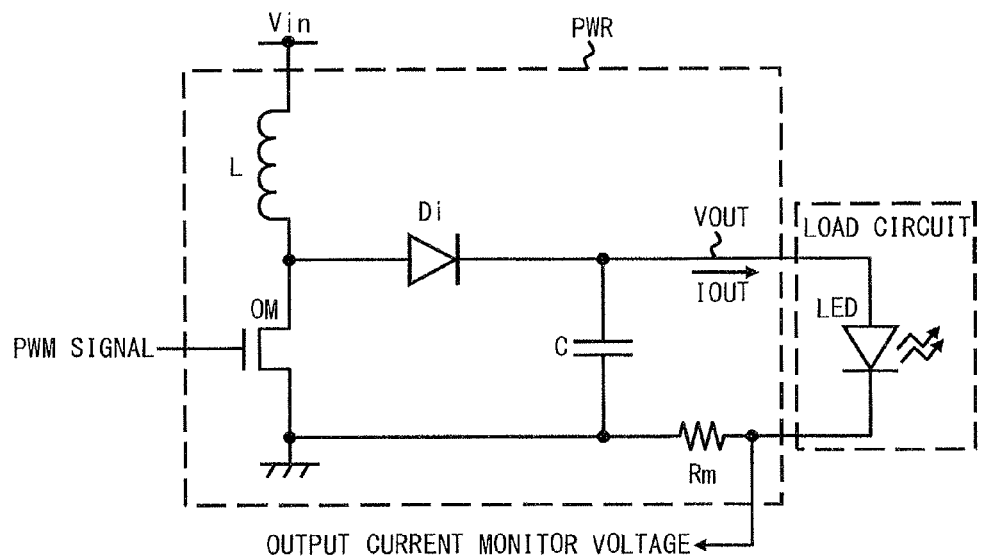
FIG. 2B is an example of a circuit diagram of a power supply circuit that is controlled by the processor system shown in FIG. 1.

The power supply circuit PWR shown in FIG. 2B is a step-up power supply circuit. The power supply circuit PWR includes an NMOS transistor OM, an inductor L, a diode Di, a capacitor C, and a resistor Rm. One end of the inductor is connected to a power supply terminal which is given an input voltage Vin. The drain of the NMOS transistor OM is connected to the other end of the inductor L; the source thereof to a ground terminal. The NMOS transistor OM receives a PWM signal at the gate thereof and performs a switching operation in accordance with the voltage level of the PWM signal. The anode of the diode Di is connected to a node between the other end of the inductor L and the drain of the NMOS transistor OM. Connected between the cathode of the diode Di and the ground terminal is the capacitor C. An output voltage VOUT corresponding to the amount of charge accumulated in the capacitor C is generated at a node between one end of the capacitor C and the cathode of the diode Di. Further, the charge accumulated in the capacitor C is provided to the LED in the form of an output current IOUT. Connected between the cathode of the LED and the ground terminal is the resistor Rm. The output current IOUT that has passed through the LED passes through the resistor Rm. That is, a voltage corresponding to the output current IOUT and the resistance of the resistor Rm occurs across the resistor Rm. This voltage serving as an output current monitor voltage is provided to the output monitor unit MON of the processor system MCU. The processor system MCU generates a PWM signal having a duty ratio or frequency such that the voltage level of the output current monitor voltage is fixed. That is, if the power supply circuit PWR shown in FIG. 2B is used, the processor system MCU and the power supply circuit PWR form a circuit that drives the LED using a constant current.

Figure 2C:
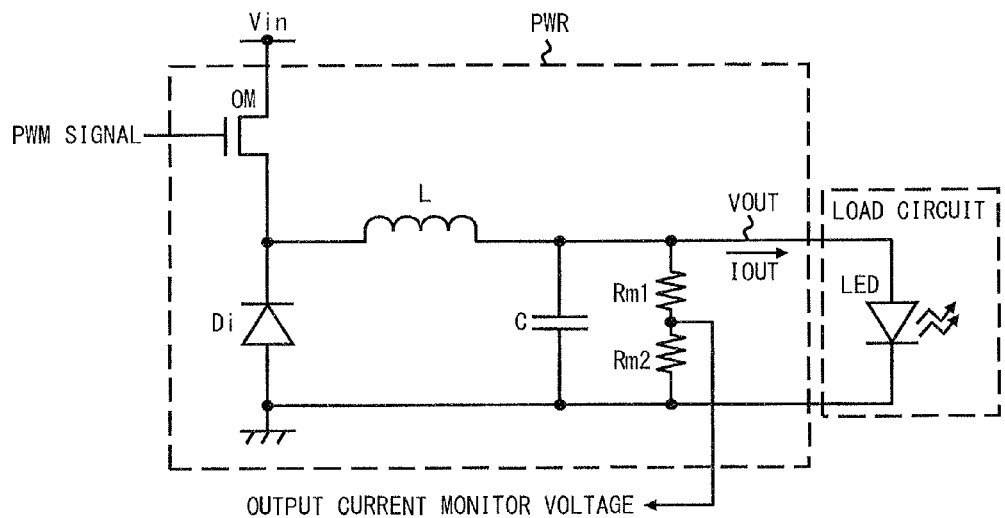
FIG. 2C is an example of a circuit diagram of a power supply circuit that is controlled by the processor system shown in FIG. 1.

The power supply circuit PWR shown in FIG. 2C is a step-down power supply circuit. The power supply circuit PWR includes an NMOS transistor OM, an inductor L, a diode Di, a capacitor C, and resistors Rm1 and Rm2. The drain of the NMOS transistor OM is connected to a power supply terminal which is given an input voltage Vin; the source thereof to the cathode of the diode Di. The NMOS transistor OM receives a PWM signal at the gate thereof and performs a switching operation in accordance with the voltage level of the PWM signal. The anode of the diode Di is connected to a ground terminal. Connected to a node between the source of the NMOS transistor OM and the cathode of the diode Di is one end of the inductor L. Connected between the other end of the inductor L and the ground terminal is the capacitor C. An output voltage VOUT corresponding to the amount of charge accumulated in the capacitor C is generated at a node between one end of the capacitor C and the other end of the inductor L. The charge accumulated in the capacitor C is provided to an LED in the form of an output current IOUT. The resistors Rm1 and Rm2 are connected together in series in a manner to be in parallel with the LED. That is, the output voltage VOUT is applied across the LED, as well as applied across the resistors Rm1 and Rm2. An output voltage monitor voltage obtained by dividing the output voltage VOUT in accordance with the resistance ratio between the two resistors is outputted from a node between the resistors Rm1 and Rm2. The output voltage monitor voltage is provided to the output monitor unit MON of the processor system MCU. The processor system MCU generates a PWM signal having a duty ratio or frequency such that the voltage level of the output voltage monitor voltage is fixed. That is, if the power supply circuit PWR shown in FIG. 2C is used, the processor system MCU and the power supply circuit PWR form a circuit that drives the LED using the constant voltage.

Figure 2D:
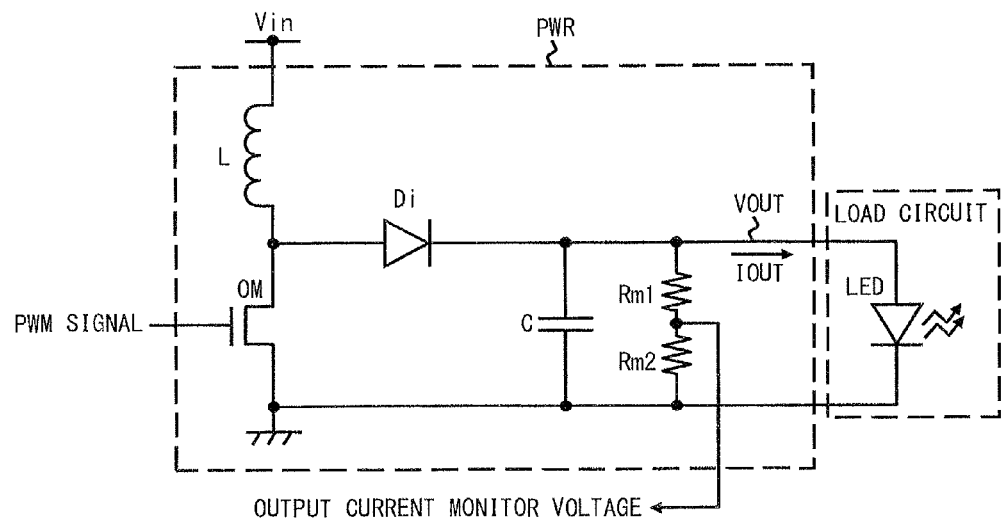
FIG. 2D is an example of a circuit diagram of a power supply circuit that is controlled by the processor system shown in FIG. 1.

The power supply circuit PWR shown in FIG. 2D is a step-up power supply circuit. The power supply circuit PWR includes an NMOS transistor OM, an inductor L, a diode Di, a capacitor C, and resistors Rm1 and Rm2. One end of the inductor is connected to a power supply terminal which is given an input voltage Vin. The drain of the NMOS transistor OM is connected to the other end of the inductor L; the source thereof to a ground terminal. The NMOS transistor OM receives a PWM signal at the gate thereof and performs a switching operation in accordance with the voltage level of the PWM signal. The anode of the diode Di is connected to a node between the other end of the inductor L and the drain of the NMOS transistor OM. Connected between the cathode of the diode Di and the ground terminal is the capacitor C. An output voltage VOUT corresponding to the amount of charge accumulated in the capacitor C is generated at a node between one end of the capacitor C and the cathode of the diode Di. Further, the charge accumulated in the capacitor C is provided to an LED in the form of an output current IOUT. The resistors Rm1 and Rm2 are connected together in series in a manner to be in parallel with the LED. That is, the output voltage VOUT is applied across the LED, as well as applied across the resistors Rm1 and Rm2. An output voltage monitor voltage obtained by dividing the output voltage VOUT in accordance with the resistance ratio between the two resistors is outputted from a node between the resistors Rm1 and Rm2. The output voltage monitor voltage is provided to the output monitor unit MON of the processor system MCU. The processor system MCU generates a PWM signal having a duty ratio or frequency such that the voltage level of the output voltage monitor voltage is fixed. That is, if the power supply circuit PWR shown in FIG. 2D is used, the processor system MCU and the power supply circuit PWR form a circuit that drives the LED using the constant voltage.

The above description of the processor system MCU is intended to describe the overall configuration of the processor system to which the present invention is applied. However, components which have not been mentioned in the description of the processor system MCU will also be additionally described in the embodiments of the present invention, as appropriate.

Figure 3:
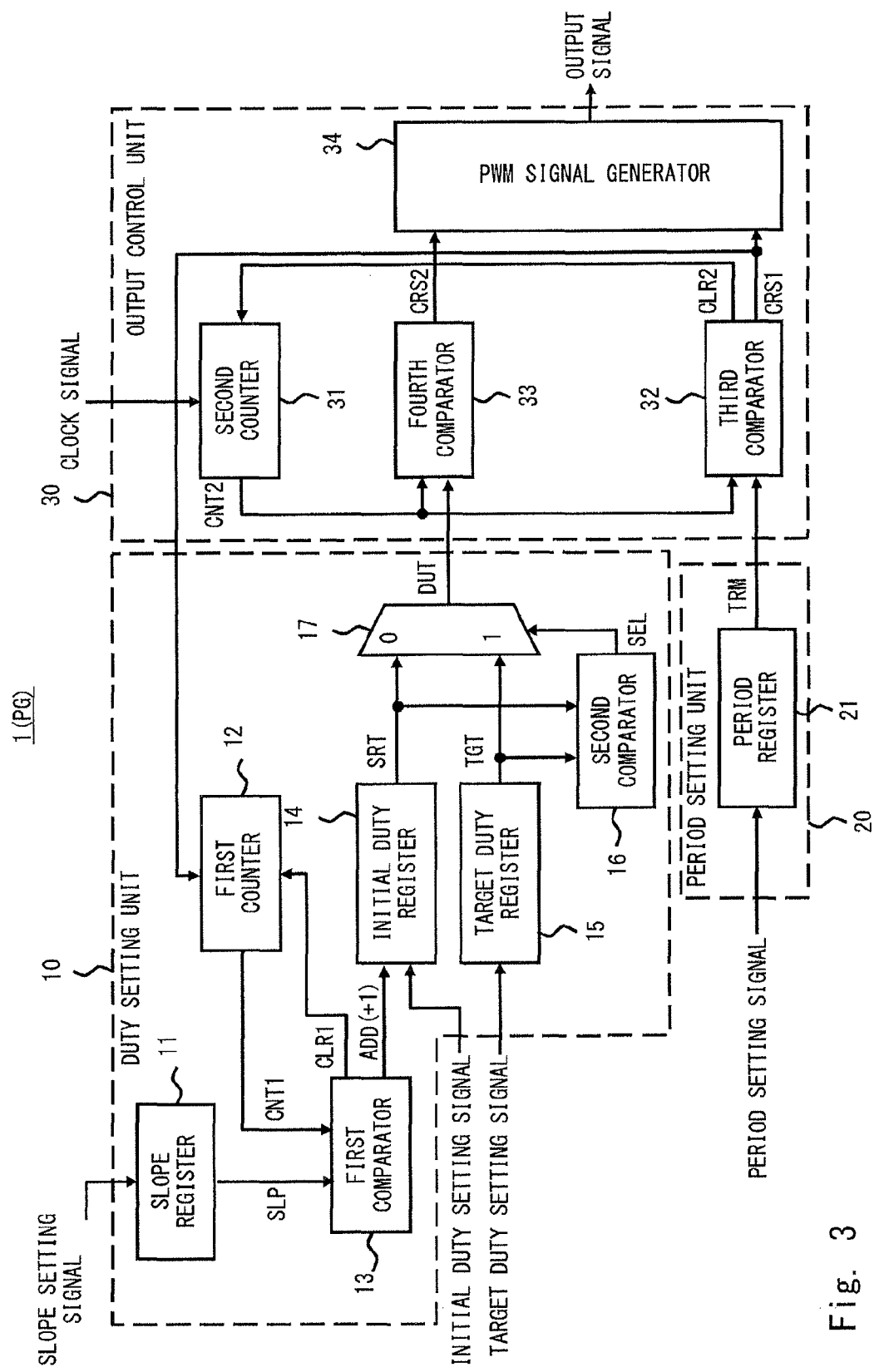
FIG. 3 is a block diagram of a PWM signal generation circuit according to a first embodiment.

One feature of the present invention is the PWM signal generation unit PG of the processor system MCU. FIG. 3 shows a block diagram of a PWM signal generation circuit 1 included in the PWM signal generation unit PG. As shown in FIG. 3, the PWM signal generation circuit 1 includes a duty setting circuit 10, a period setting unit 20, and an output control unit 30. The PWM signal generation circuit 1 receives a clock signal, an initial duty setting signal, a target duty setting signal, a slope setting signal, and a period setting signal. While, in the present embodiment, the initial duty setting signal, the target duty setting signal, the slope setting signal, and the period setting signal are provided by the computing core PE of the processor system MCU, these signals may be provided by another circuit.

The initial duty setting signal designates the value of the initial duty ratio of a PWM signal, which is the duty ratio of a PWM signal whose generation has been just started. The target duty setting signal designates the value of the target duty ratio of the PWM signal. The slope setting signal designates a slope setting value, which designates the rate at which the duty ratio is changed from the initial duty ratio to the target duty ratio.

The duty setting circuit 10 generates a duty control signal DUT that designates a duty ratio corresponding to each period of a PWM signal on the basis of the initial duty setting signal, the target duty setting signal, and the slope setting signal. The duty setting circuit 10 increases the value of the initial duty ratio to the value of the target duty ratio each time the number of the clock pulse of the clock signal reaches the value of the period setting signal reaches the value of the slope setting signal. In the present embodiment, the number of the clock pulse of the clock signal reaches the value of the period setting signal is obtained by counting the pulse number of a period start signal CRS1 described below.

More specifically, the duty setting circuit 10 includes a first counter 12, a first comparator 13, a second comparator 16, and a selection circuit 17. The duty setting circuit 10 also includes a slope register 11, an initial duty register 14, and a target duty register 15. The slope register 11 stores a slope setting value SLP provided by the slope setting signal. The initial duty register 14 stores the value of the initial duty ratio (hereafter referred to as initial duty value SRT) provided by the initial duty setting signal. The target duty register 15 stores the value of the target duty ratio (hereafter referred to as target duty value TGT) provided by the target duty setting signal.

The first counter 12 generates a first count value CNT1 by counting the number of the clock pulse of the clock signal reaches the value of the period setting signal, that is, by counting the pulse number of the period start signal CRS1. In response to the first count value CNT1 reaching the slope setting signal, the first comparator 13 resets the first count value CNT1 to the initial count value, as well as increases the value of the initial duty ratio. More specifically, in response to the first count value CNT1 reaching the slope setting signal, the first comparator 13 asserts a first reset signal CLR1 to be provided to the first counter 12. In response to the first reset signal CLR1 being asserted, the first counter 12 resets the first count value CNT1 to the initial count value (e.g., 1). Further, in response to the first count value CNT1 reaching the slope setting value SLP, the first comparator 13 asserts an addition instruction signal ADD that increases the initial duty value SRT. In response to the addition instruction signal ADD being asserted, the initial duty register 14 increases the initial duty value SRT stored therein (for example, the initial duty register 14 adds 1 to the initial duty value SRT stored therein to update the initial duty value SRT).

The second comparator 16 generates a selection signal SEL indicating the magnitude relationship between the initial duty value SRT stored in the initial duty register 14 and the target duty value TGT stored in the target duty register 15. More specifically, when the target duty value is smaller than the initial duty value SRT, the second comparator 16 sets the selection signal SEL to a first logic level (e.g., 0). When the initial duty value SRT is greater than or equal to the target duty value TGT, the second comparator 16 sets the selection signal SEL to a second logic level (e.g., 1).

In accordance with the logic level of the selection signal SEL, the selection circuit 17 outputs one of the initial duty value SRT and the target duty value TGT as the duty control signal DUT. More specifically, when the selection signal SEL indicates 0, the selection circuit 17 outputs the initial duty value SRT as the duty control signal DUT; when the selection signal SEL indicates 1, it outputs the target duty value TGT as the duty control signal DUT.

The period setting unit 20 outputs a period setting value TRM indicating the length of one period of a PWM signal, on the basis of the period setting signal. More specifically, the period setting unit 20 includes a period register 21. The period register 21 stores the period setting value TRM indicated by the period setting signal. The period setting unit 20 outputs the period setting value TRM stored in the period register 21.

The output control unit 30 generates a PWM signal having a duty ratio that corresponds to a period corresponding to the period setting value as well as corresponds to the value of the duty control signal, on the basis of the clock signal. The output control unit 30 includes a second counter 31, a third comparator 32, a fourth comparator 33, and a PWM signal generator 34.

The second counter 31 counts the clock pulse of the clock signal to generate a second count value CNT2. The third comparator 32 receives the period setting value TRM and the second count value CNT2. In response to the second count value CNT2 reaching the period setting value TRM, the third comparator 32 resets the second count value CNT2 to the initial count value, as well as outputs the period start signal CRS1 indicating the start of a period. More specifically, in response to the second count value CNT2 reaching the period setting value TRM, the second comparator 32 asserts a second reset signal CLR2 to be provided to the second counter 31. In response to the second reset signal CLR2 being asserted, the second counter 31 resets the second count value CNT2 to the initial count value (e.g., 1).

In response to the second count value CNT2 reaching a value indicating a duty ratio indicated by the duty control signal DUT, the fourth comparator 33 outputs a switching signal CRS2 providing an instruction to switch the logic level of the PWM signal.

In accordance with the period start signal CRS1, the PWM signal generator 34 sets the logic level of the output signal (PWM signal) to an initial logic level; in accordance with the switching signal CRS2, the PWM signal generator 34 sets the logic level of the PWM signal to an end logic level, which is a logic level opposite to the initial logic level. In the present embodiment, the logic level at the start of one period (initial logic level) of a PWM signal to be outputted is set to 1; the logic level at the end of one period (end logic level) of the PWM signal is set to 0.

Figure 4:
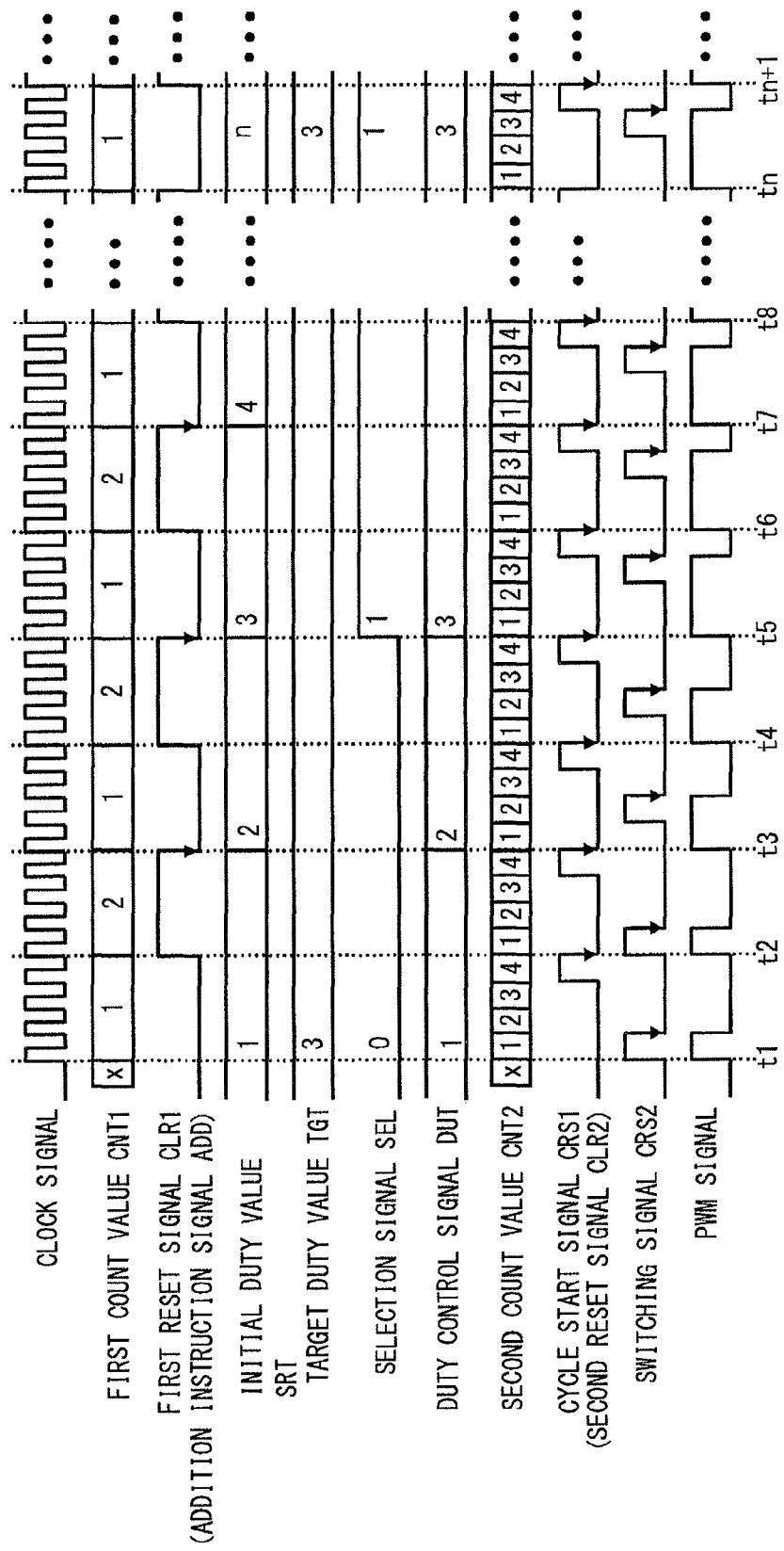
FIG. 4 is a timing chart showing an operation of the PWM signal generation circuit according to the first embodiment.

Next, an operation of the PWM signal generation circuit 1 according to the first embodiment will be described. In response to the initial duty value SRT, the target duty value TGT, the slope setting value SLP, and the period setting value TRM being stored in the corresponding registers using the initial duty setting signal, the target duty setting signal, the slope setting signal, and the period setting signal, the PWM signal generation circuit 1 starts a PWM signal generation process. FIG. 4 shows a timing chart showing an operation in which the PWM signal generation circuit 1 generates a PWM signal in accordance with these setting values. As shown in FIG. 4, the PWM signal generation circuit 1 performs the PWM signal generation process in synchronization with the clock signal.

In the timing chart shown in FIG. 4, at timing t1, the initial duty value SRT, the target duty value TGT, the slope setting value SLP, and the period setting value TRM are stored in the corresponding registers. In the example operation shown in FIG. 4, at timing t1, the initial duty value SRT is set to 1; the target duty value TGT to 3; the slope setting value SLP to 2; and the period setting value TRM to 4. In response to these setting values being set in the registers, the first counter 12 starts counting the pulse number of the period start signal CRS1, whereas the second counter 31 starts counting the clock pulse of the clock signal.

Since the initial duty value SRT is smaller than the target duty value TGT at timing t1, the second comparator 16 sets the selection signal SEL to 0. Thus, at timing t1, the selection circuit 17 outputs the initial duty value SRT (in the example shown in FIG. 4, 1) as the duty control signal DUT. Since the value of the duty control signal DUT is the same as the second count value CNT2 at timing t1, the fourth comparator 33 keeps the switching signal CRS2 at a high level until a subsequent clock signal is inputted. In response to the second count value CNT2 making a transition to 2, the fourth comparator 33 sets the switching signal CRS2 to a low level. On the falling edge of the switching signal CRS2, the PWM signal generator 34 switches the PWM signal from a high level to a low level. Subsequently, when the second count value CNT2 reaches the period setting value TRM (in the example shown in FIG. 4, 4), the third comparator 32 keeps the period start signal CRS1 at a high level as long as the second count value CNT2 is 4. Also, as long as the second count value CNT2 is 4, the third comparator 32 asserts the second reset signal CLR2 (keeps it at a high level). At timing t2, in accordance with the second reset signal CLR2, the second count value CNT2 is reset to the initial count value (e.g., 1). Since the second count value CNT2 disagrees with the period setting value TRM at timing t2, the period start signal CRS1 is switched to a low level. On the falling edge of the period start signal CRS1, the PWM signal generator 34 sets the PWM signal to the initial logic level (e.g., high level).

Subsequently, during the period between timings t2 and t3, the second count value CNT2 makes transitions from 1 to 4 in accordance with the clock signal. In accordance with the transitions of the second count value CNT2, the output control unit 30 repeats the operations performed between timings t1 and t2.

On the other hand, the first count value CNT2 is not reset at timing t2, and the period start signal CRS1 is continuously counted during the period between timings t1 and t3. That is, the first count value CNT1 makes a transition from 1 to 2 during the period between timings t1 and t3. When the first count value CNT1 reaches the slope setting value SLP (in the example shown in FIG. 4, 2), the first comparator 13 asserts the first reset signal CLR1 and the addition instruction signal ADD (keeps these signals at a high level) as long as the first count value CNT1 is 2. In response to the first reset signal CLR1 being asserted, the first count value CNT1 is reset to the initial count value (e.g., 1). Since the first count value CNT1 disagrees with the slope setting value SLP at timing t3, the first comparator 13 negates the addition instruction signal ADD. In response to the addition instruction signal ADD being negated, the initial duty register 14 updates the initial duty value SRT using a value obtained by adding 1 to the initial duty value SRT.

During the period between timings t1 and t3, the addition instruction signal ADD is negated until the first count value CNT1 reaches the slope setting value SLP. Accordingly, the initial duty value SRT remains the same. For this reason, a value indicated by the duty control signal DUT remains the same during the period between timings t1 and t3. That is, the duty ratio of the PWM signal remains the same during the period between timings t1 and t3.

Since the initial duty value SRT is smaller than the target duty value TGT at timing t3, the second comparator 16 sets the selection signal SEL to 0. Thus, at timing t3, the selection circuit 17 outputs the initial duty value SRT (in the example shown in FIG. 4, 2) as the duty control signal DUT. The second count value CNT2 makes a transition to 2, so that the second count value CNT2 agrees with the duty control signal DUT. Thus, the fourth comparator 33 keeps the switching signal CRS2 at a high level until a subsequent clock signal is inputted. In response to the second count value CNT2 making a transition to 3, the fourth comparator 33 sets the switching signal CRS2 to a low level. On the falling edge of the switching signal CRS2, the PWM signal generator 34 switches the PWM signal from a high level to a low level. Subsequently, when the second count value CNT2 reaches the period setting value TRM (in the example shown in FIG. 4, 4), the third comparator 32 keeps the period start signal CRS1 at a high level as long as the second count value CNT2 is 4. The third comparator 32 asserts the second reset signal CLR2 (for example, sets it to a high level) as long as the second count value CNT2 is 4. In accordance with the second reset signal CLR2, the second count value CNT2 is reset to the initial count value (e.g., 1) at timing t4. Further, since the second count value CNT2 disagrees with the period setting value TRM at timing t4, the period start signal CRS1 is switched to a low level. On the falling edge of the period start signal CRS1, the PWM signal generator 34 sets the PWM signal to the initial logic level (e.g., high level).

Subsequently, during the period between timings t4 and t5, the second count value CNT2 makes transitions from 1 to 4 in accordance with the clock signal. In response to the second count value CNT2 making the transitions, the output control unit 30 repeats the operations performed between timings t3 and t4.

On the other hand, the first count value CNT1 is not reset at timing t4, and the period start signal CRS1 is continuously counted during the period between timings t3 and t5. That is, the first count value CNT1 makes a transition from 1 to 2 during the period between timings t3 and t5. When the first count value CNT1 reaches the slope setting value SLP (in the example shown in FIG. 4, 2), the first comparator 13 asserts the first reset signal CLR1 and the addition instruction signal ADD (keeps these signals at a high level) as long as the first count value CNT1 is 2. In response to the first reset signal CLR1 being asserted, the first count value CNT1 is reset to the initial count value (e.g., 1). Since the first count value CNT1 disagrees with the slope setting value SLP at timing t5, the first comparator 13 negates the addition instruction signal ADD. In response to the addition instruction signal ADD being negated, the initial duty register 14 updates the initial duty value SRT using a value obtained by adding 1 to the initial duty value SRT.

During the period between timings t3 and t5, the addition instruction signal ADD is negated until the first count value CNT1 reaches the slope setting value SLP. Accordingly, the initial duty value SRT remains the same. For this reason, a value indicated by the duty control signal DUT remains the same during the period between timings t3 and t5. That is, the duty ratio of the PWM signal remains the same during the period between timings t3 and t5. The value of the duty control signal DUT during the period between timings t3 and t5 is greater than that during the period between timings t1 and t3. Accordingly, the duty ratio of the PWM signal generated during the period between timings t3 and t5 is greater than the duty ratio of the PWM signal generated during the period between timings t1 and t3.

Since the initial duty value SRT agrees with the target duty value TGT at timing t5, the second comparator 16 sets the selection signal SEL to 1. Thus, at timing t5, the selection circuit 17 outputs the target duty value TGT (in the example shown in FIG. 4, 3) as the duty control signal DUT. Subsequently, the second count value CNT2 makes a transition to 3, so that the second count value CNT2 agrees with the duty control signal DUT. Thus, the fourth comparator 33 keeps the switching signal CRS2 at a high level until a subsequent clock signal is inputted. In response to the second count value CNT2 making a transition to 4, the fourth comparator 33 sets the switching signal CRS2 to a low level. On the falling edge of the switching signal CRS2, the PWM signal generator 34 switches the PWM signal from a high level to a low level. Subsequently, when the second count value CNT2 reaches the period setting value TRM (in the example shown in FIG. 4, 4), the third comparator 32 keeps the period start signal CRS1 at a high level as long as the second count value CNT2 is 4. The third comparator 32 also asserts the second reset signal CLR2 (for example, keeps it at a high level) as long as the second count value CNT2 is 4. In response to the second reset signal CLR2, the second count value CNT2 is reset to the initial count value (e.g., 1) at timing t6. Further, since the second count value CNT2 disagrees with the period setting value TRM at timing t6, the period start signal CRS1 is switched to a low level. On the falling edge of the period start signal CRS1, the PWM signal generator 34 sets the PWM signal to the initial logic level (e.g., high level).

Subsequently, during the period between timings t6 and t7, the second count value CNT2 makes transitions from 1 to 4 in accordance with the clock signal. In response to the second count value CNT2 making the transitions, the output control unit 30 repeats the operations performed during the period between timings t5 and t6.

On the other hand, the first count value CNT1 is not reset at timing t6, and the period start signal CRS1 is continuously counted during the period between timings t5 and t7. That is, the first count value CNT1 makes a transition from 1 to 2 during the period between timings t5 and t7. When the first count value CNT1 reaches the slope setting value SLP (in the example shown in FIG. 4, 2), the first comparator 13 asserts the first reset signal CLR1 and the addition instruction signal ADD (keeps these signals at a high level) as long as the first count value CNT1 is 2. In response to the first reset signal CLR1 being asserted, the first count value CNT1 is reset to the initial count value (e.g., 1). Since the first count value CNT1 disagrees with the slope setting value SLP at timing t5, the first comparator 13 negates the addition instruction signal ADD. In response to the addition instruction signal ADD being negated, the initial duty register 14 updates the initial duty value SRT using a value obtained by adding 1 to the initial duty value SRT.

From timing t5 onward, the target duty value TGT remains a value smaller than or equal to the initial duty value SRT even when the initial duty value SRT is increased. For this reason, a value indicated by the duty control signal DUT remains the same (target duty value TGT) from timing t5 onward. That is, the duty ratio of the PWM signal remains the same from timing t5 onward. From timing t5 onward, the value of the duty control signal DUT remains greater than that during the period between timings t3 and t5. Accordingly, the duty ratio of the PWM signal generated from timing t5 onward remains greater than that of the PWM signal generated during the period between timings t3 and t5.

Assuming that a PWM signal generated by the PWM signal generation circuit 1 according to the first embodiment is provided to a power supply circuit (for example, the power supply circuit PWR of FIG. 2B), the relationship between soft-start control of the PWM signal and an output voltage is shown in FIGS. 5 to 9. Referring to FIGS. 5 to 9, there will be described the relationship between the initial duty value SRT, the target duty value TGT, and the slope setting value SLP used by the PWM signal generation circuit 1 according to the first embodiment, and the output voltage. In examples shown in FIGS. 5 to 7, it is assumed that the target duty value TGT and the slope setting value SLP are constant; in examples shown in FIGS. 5, 8, and 9, it is assumed that the initial duty value SRT and the target duty value SRT are constant.

Figure 5:
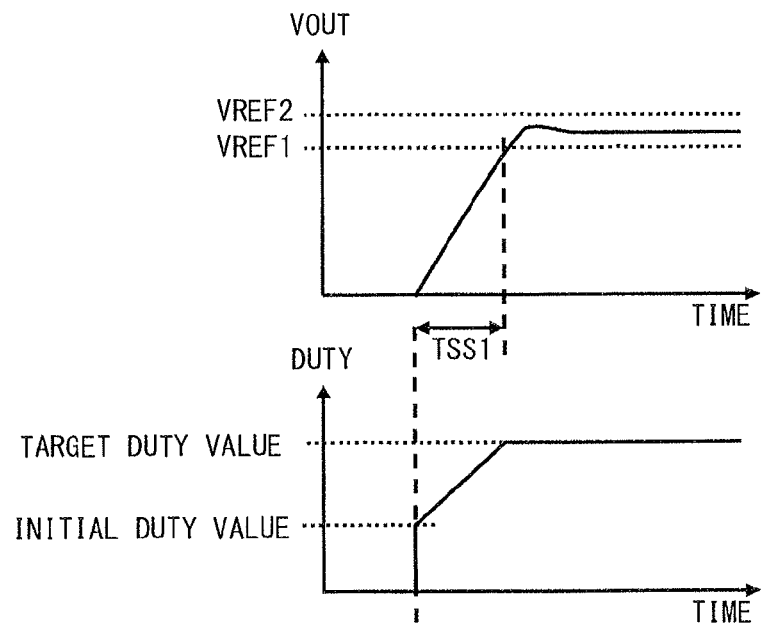
FIG. 5 is a first timing chart showing the relation between the initial duty value and target duty value which are used in a PWM signal generation circuit, and the output voltage of a power supply circuit according to the first embodiment.

A first timing chart shown in FIG. 5 shows the rising waveform of the output voltage when the initial duty value SRT and the target duty value TGT are set to appropriate values. In the example shown in FIG. 5, it takes time TSS1 after generation of a PWM signal is started until the output voltage reaches a target lower-limit value VREF1. After exceeding the target lower-limit value VREF1, the output voltage is stabilized at voltage levels between the target lower-limit value VREF1 and a target upper-limit value VREF2.

Figure 6:
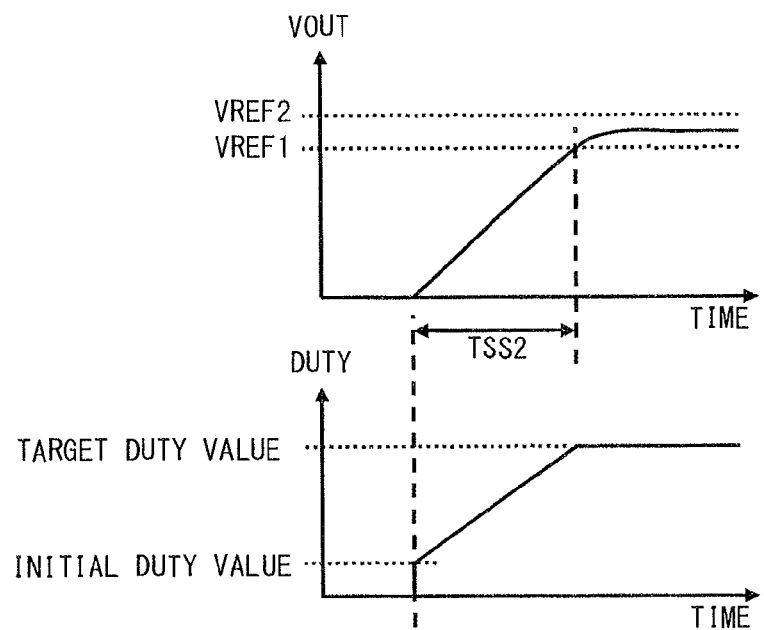
FIG. 6 is a second timing chart showing the relation between the initial duty value and target duty value which are used in a PWM signal generation circuit, and the output voltage of a power supply circuit according to the first embodiment.

In a second timing chart shown in FIG. 6, the initial duty value SRT is smaller than that shown in the first timing chart. Since the slope setting value SLP is the same as that shown in FIG. 5, time TSS2 taken until the output voltage reaches the target lower-limit value VREF1 is longer than TSS1 in FIG. 5. In this case, if time TSS2 is longer than a standard value, a problem occurs.

Figure 7:
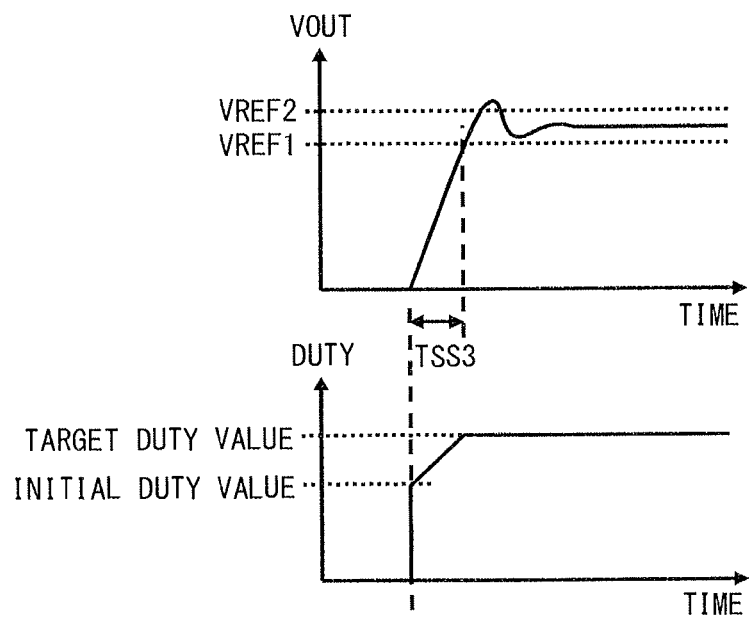
FIG. 7 is a third timing chart showing the relation between the initial duty value and target duty value which are used in a PWM signal generation circuit, and the output voltage of a power supply circuit according to the first embodiment.

In a third timing chart shown in FIG. 7, the initial duty value SRT is greater than that shown in the first timing chart. Since the slope setting value SLP is the same as that shown in FIG. 5, time TSS2 taken until the output voltage reaches the target lower-limit value VREF1 is shorter than TSS1 in FIG. 5. However, as shown in FIG. 7, there is a period during which the output voltage exceeds the target upper-limit value VREF2. That is, the example shown in FIG. 7 involves a problem that an overshoot may occur on the rising edge of the output voltage.

Figure 8:
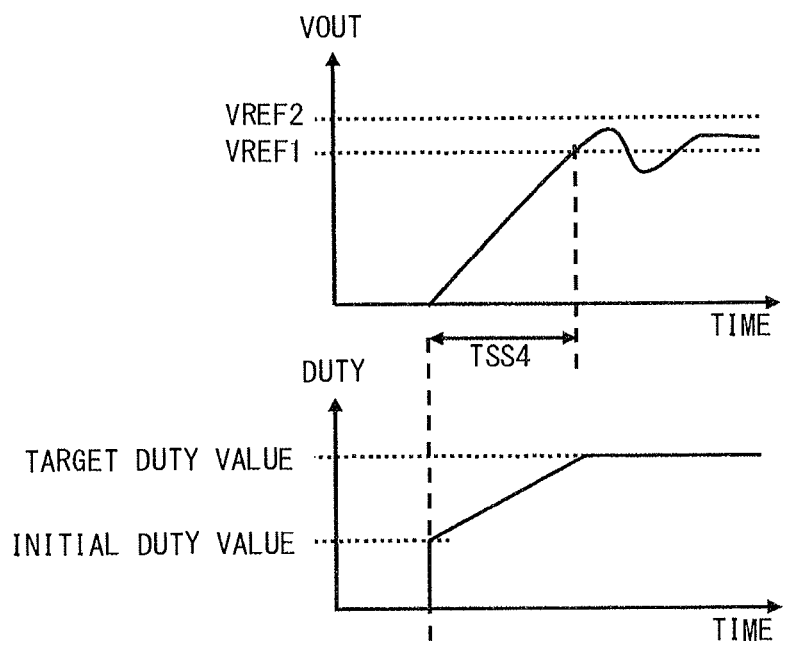
FIG. 8 is a fourth timing chart showing the relation between the initial duty value and target duty value which are used in a PWM signal generation circuit, and the output voltage of a power supply circuit according to the first embodiment.

In a fourth timing chart shown in FIG. 8, the slope setting value SLP is smaller than that shown in the first timing chart. Since the slope setting value SLP is smaller than that shown in FIG. 5, time TSS4 taken until the output voltage reaches the target lower-limit value VREF1 is longer than TSS1 in FIG. 5. In this case, as shown in FIG. 8, there is a period during which the output voltage falls below the target lower-limit value VREF1 again after exceeding the target lower-limit value VREF1. That is, the example shown in FIG. 8 involves a problem that an undershoot may occur on the rising edge of the output voltage.

Figure 9:
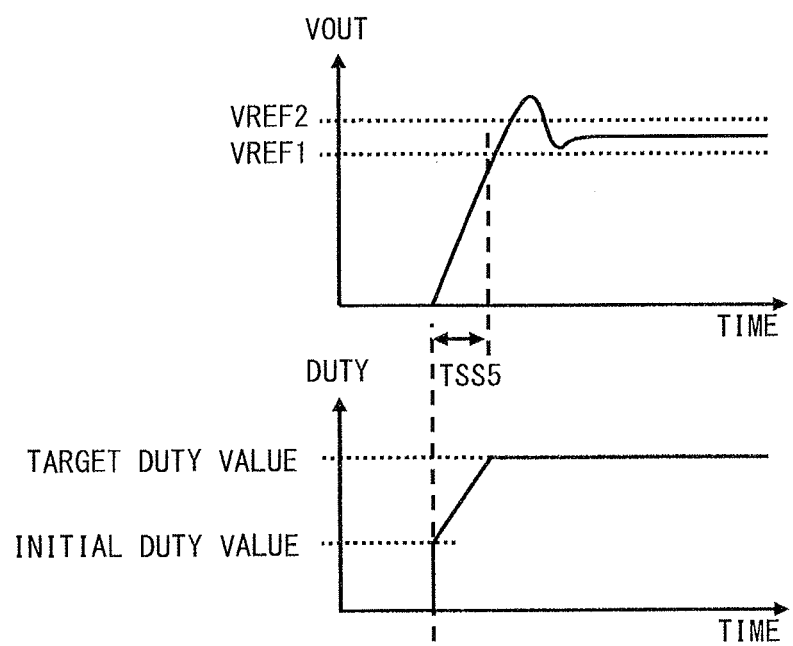
FIG. 9 is a fifth timing chart showing the relation between the initial duty value and target duty value which are used in a PWM signal generation circuit, and the output voltage of a power supply circuit according to the first embodiment.

In a fifth timing chart shown in FIG. 9, the slope setting value SLP is greater than that shown in the first timing chart. Since the slope setting value SLP is greater than that shown in FIG. 5, time TSS5 taken until the output voltage reaches the target lower-limit value VREF1 is shorter than TSS1 in FIG. 5. However, as shown in FIG. 9, there is a period during which the output voltage exceeds the target upper-limit value VREF2. That is, the example shown in FIG. 9 involves a problem that an overshoot may occur on the rising edge of the output voltage.

Stably raising the output voltage requires presetting an initial duty value SRT, a target duty value TGT, and a slope setting value SLP such that the output voltage has a rising waveform as shown in FIG. 5. Such setting values can be optimized by previously measuring the output voltage using the PWM signal generation circuit 1 to obtain optimum values. Note that increasing or reducing the target duty value TGT allows the ultimate voltage level of the output voltage to be increased or reduced.

As described above, in response to the initial duty value SRT, the target duty value TGT, the slope setting value SLP, and the period setting value TRM being set, the PWM signal generation circuit 1 according to the first embodiment starts generating a PWM signal. At this time, the PWM signal generation circuit 1 according to the first embodiment determines the duty ratio of the PWM signal directly from these setting values. That is, when the PWM signal generation circuit 1 starts generating a PWM signal, it can determine the duty ratio of the PWM signal without having to calculate it. Further, since the PWM signal generation circuit 1 does not require a reference voltage or the like which is provided as an analog voltage, it can start generating a PWM signal without having to wait for such a voltage to rise. For these reasons, the PWM signal generation circuit 1 can generate a PWM signal even immediately after starting generating the PWM signal.

Further, the PWM signal generation circuit 1 according to the first embodiment generates a PWM signal in synchronization with the clock signal, as well as changes the duty ratio of the PWM signal in accordance with the counted frequency of the clock signal. To change the duty ratio, the PWM signal generation circuit 1 only updates the value of the duty ratio in accordance with the counted clock pulse. Thus, the PWM signal generation circuit 1 can soft-start control the PWM signal while simplifying a process associated with computation.

Further, the PWM signal generation circuit 1 according to the first embodiment can optimize rising characteristics of a voltage outputted by a power supply circuit or the like by changing the setting values of the initial duty value SRT, the target duty value TGT, and the slope setting value SLP. If the load circuit driven by the power supply circuit is an LED as shown in FIGS. 2A to 2D, there is a problem that an overshoot of the output voltage may reduce the life of the LED. There is also a problem that an undershoot of the output voltage that drives the LED may cause flicker or the like. However, the PWM signal generation circuit 1 according to the first embodiment can optimize the rising waveform of the PWM signal using the setting values and thus can easily solve the above problems associated with the circuits to be controlled (power supply circuit and load circuit).

Further, the PWM signal generation circuit 1 according to the first embodiment can be composed of circuits which are small in size, such as counters, registers, comparators, and a selection circuit. Thus, it is possible to reduce the circuit size and chip area of the PWM signal generation circuit 1.

Second Embodiment

In a second embodiment, there will be described a method for automatically adjusting the initial duty value SRT, the target duty value TGT, the slope setting value SLP, or the like used in the PWM signal generation operation according to the first embodiment. The method for adjusting the setting values according to the second embodiment uses the computing core PE, the output monitor unit MON, the memory MEM, and the PWM signal generation unit PG shown in FIG. 1. Also, in the second embodiment, a PWM signal generation circuit 2 is used as the PWM signal generation unit PG.

Figure 10:
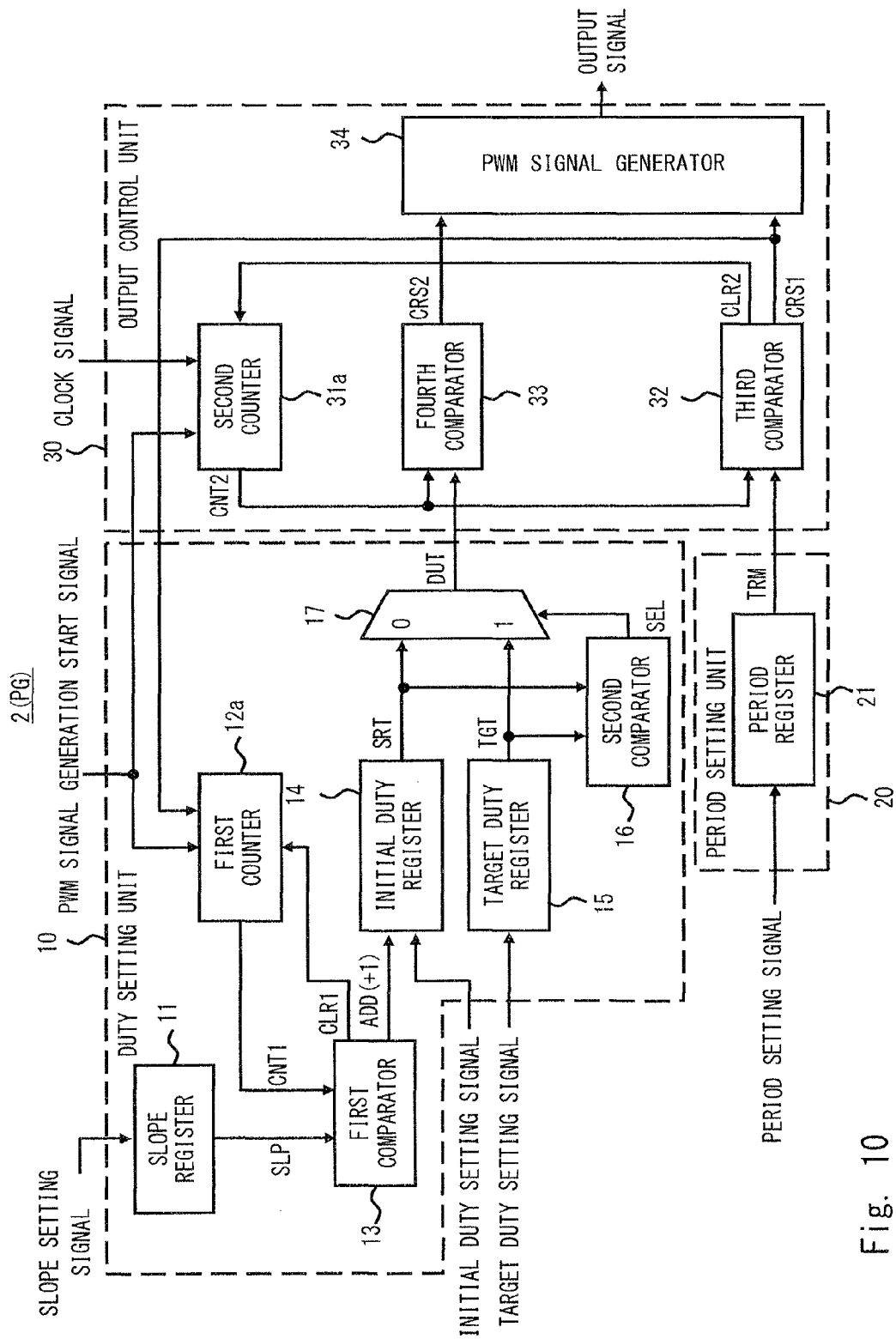
FIG. 10 is a block diagram of a PWM signal generation circuit according to a second embodiment.

FIG. 10 shows a block diagram of the PWM signal generation circuit 2 according to the second embodiment. As shown in FIG. 10, the PWM signal generation circuit 2 is obtained by adding an operation control function using a PWM signal generation start signal, to the PWM signal generation circuit 1 according to the first embodiment. The PWM signal generation circuit 2 is provided with a first counter 12a and a second counter 31a in place of the first counter 12 and the second counter 31, respectively.

The first counter 12a counts the number of the clock pulse of a clock signal reaches the value of the period setting signal, that is, counts the pulse number of the period start signal CRS1 to generate the first count value CNT1. In response to the first clear signal CLR1 being asserted, the first counter 12a resets the first count value CNT1 to the initial count value. When the PWM signal generation start signal is asserted, the first counter 12a counts the clock pulse of the clock signal; when the PWM signal generation start signal is negated, it stops counting the clock pulse of the clock signal.

The second counter 31a counts the clock pulse of the clock signal to generate the second count value CNT2. In response to the second clear signal CLR2 being asserted, the second counter 31a resets the second count value CNT2 to the initial count value. When the PWM signal generation start signal is asserted, the second counter 31a counts the clock pulse of the clock signal; when the PWM signal generation start signal is negated, it stops counting the clock pulse of the clock signal.

When the first counter 12a and the second counter 31a are stopping, these counters do not count the clock pulse of the clock signal. Accordingly, the PWM signal generation circuit 2 stops generating a PWM signal. In contrast, when the first counter 12a and the second counter 31a are operating, the PWM signal generation circuit 2 generates a PWM signal in accordance with the counting operation of these counters. That is, the PWM signal generation start signal is a signal for controlling the start and stop of a PWM signal generation process by the PWM signal generation circuit 2. In the second embodiment, it is assumed that the PWM signal generation start signal is a signal whose assertion and negation the computing core PE controls.

Figure 11:
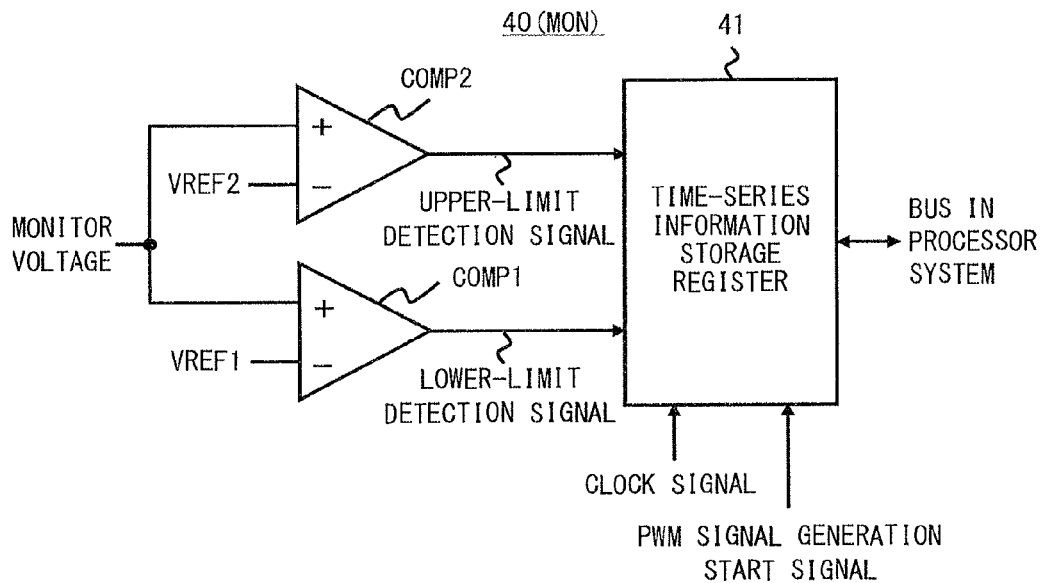
FIG. 11 is a first example of a detailed block diagram of an output monitor unit according to the second embodiment.
Figure 12:
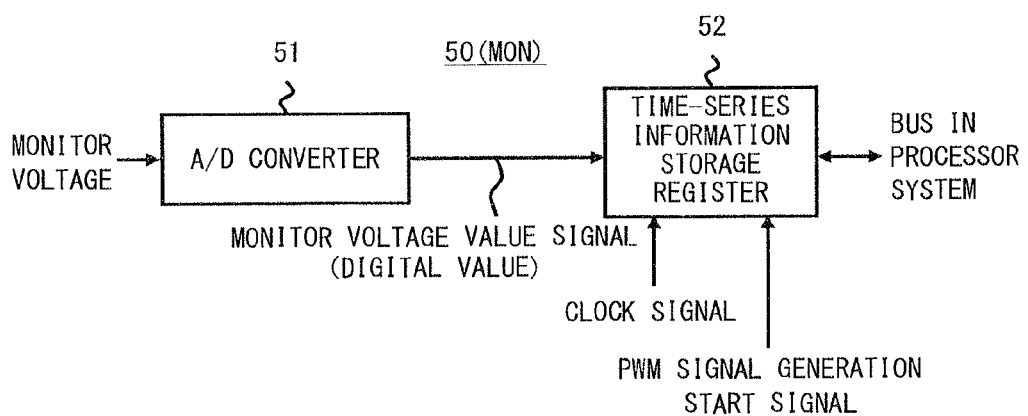
FIG. 12 is a second example of a detailed block diagram of an output monitor unit according to the second embodiment.

FIGS. 11 and 12 show detailed block diagrams of the output monitor unit MON. FIG. 11 shows an example of the output monitor unit MON. An output monitor unit 40 shown in FIG. 11 includes comparators COMP1 and COMP2 and a time-series information storage register 41.

The comparator COMP1 receives a monitor voltage obtained from the circuit to be controlled (for example, power supply circuit PWR) at a non-inverting input terminal thereof and receives the target lower-limit value VREF1 at an inverting input terminal thereof. When the monitor voltage is greater than the target lower-limit value VREF1, the comparator COMP1 sets the output signal (for example, lower-limit detection signal) to a high level.

The comparator COMP2 receives a monitor voltage obtained from the power supply circuit PWR at a non-inverting input terminal thereof and receives the target upper-limit value VREF2 at an inverting input terminal thereof. When the monitor voltage is greater than the target lower limit VREF2, the comparator COMP2 sets the output signal (for example, upper-limit detection signal) to a high level.

The time-series information storage register 41 receives a clock signal (for example, a signal similar to the clock signal provided to the PWM signal generation circuit 2) and a PWM signal generation start signal. While the PWM signal generation start signal is asserted, the time-series information storage register 41 accumulates the logic levels of lower-limit and upper-limit detection signals using the clock signal as a sampling clock. That is, the time-series information storage register 41 generates time-series information of measured values having the point in time when the PWM signal generation start signal is asserted, as a start point in time and having the point in time when the PWM signal generation start signal is negated, as an end point in time. This time-series information is referred to by the computing core PE.

FIG. 12 shows a block diagram showing another form of the output monitor unit MON. An output monitor unit 50 shown in FIG. 12 includes an A/D converter 51 and a time-series information storage register 52.

The A/D converter 51 outputs a monitor voltage value signal corresponding to the voltage level of a monitor voltage obtained from the power supply circuit PWR. This monitor voltage value signal is a digital signal and has a value indicating the voltage level of the monitor voltage.

The time-series information storage register 52 receives a clock signal (for example, a signal similar to the clock signal provided to the PWM signal generation circuit 2) and a PWM signal generation start signal. While the PWM signal generation start signal is asserted, the time-series information storage register 41 accumulates the values of monitor voltage value signals using the clock signal as a sampling clock. That is, the time-series information storage register 52 generates time-series information of measured values having the point in time when the PWM signal generation start signal is asserted, as a start point in time and having the point in time when the PWM signal generation start signal is negated, as an end point in time. This time-series information is referred to by the computing core PE.

Figure 13:
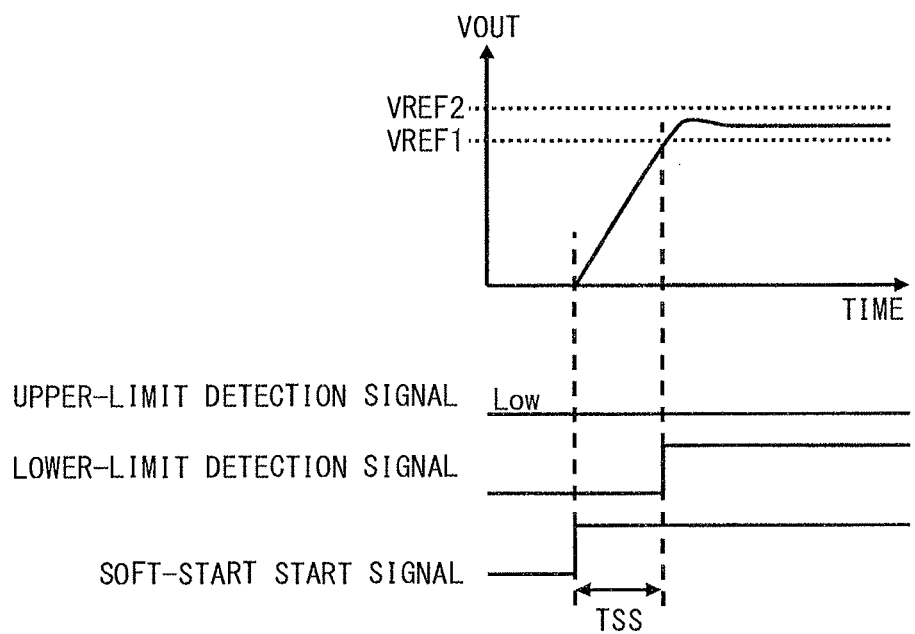
FIG. 13 is a first timing chart showing an output voltage detection result using the output monitor unit shown in FIG. 11.
Figure 14:
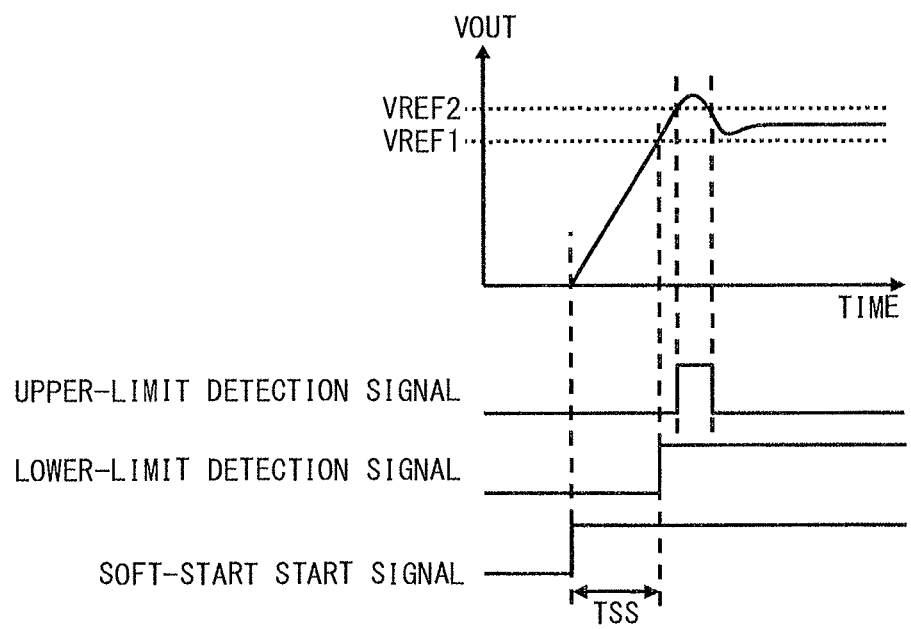
FIG. 14 is a second timing chart showing an output voltage detection result using the output monitor unit shown in FIG. 11.
Figure 15:
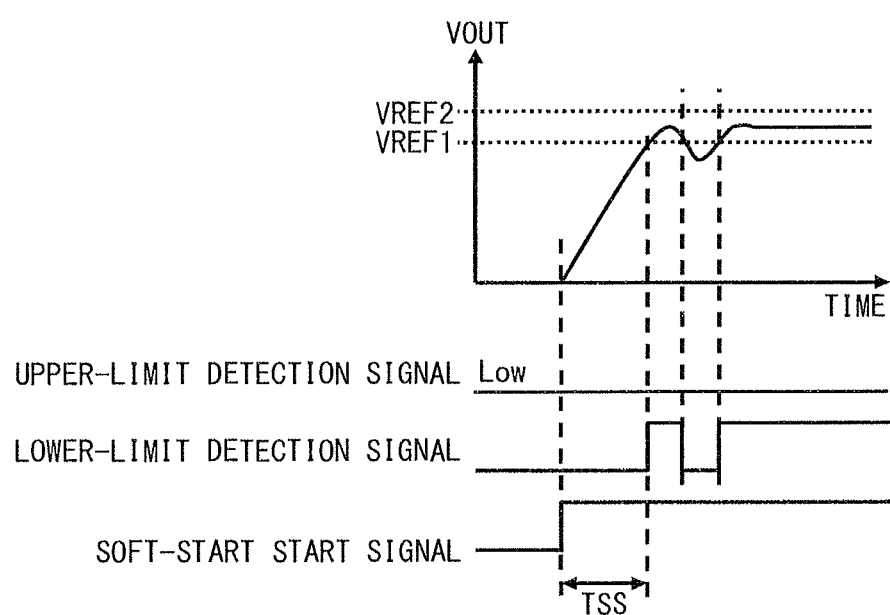
FIG. 15 is a third timing chart showing an output voltage detection result using the output monitor unit shown in FIG. 11.

Now, there will be described the detection result of a monitor voltage when the output monitor unit 40 is used as the output monitor unit MON. FIGS. 13 to 15 show timing charts showing the relationship between the rising waveform of an output voltage generated by the power supply circuit and changes in upper-limit and lower-limit detection signals when monitoring the rising waveform of the output voltage.

A first timing chart shown in FIG. 13 shows a timing chart where an overshoot and undershoot of the output voltage fall within a predetermined range defined by the target lower-limit value VREF1 and the target upper-limit value VREF2. In an example shown in FIG. 13, the PWM signal generation start signal is asserted; time TSS elapses; and subsequently the output voltage exceeds the target lower-limit value VREF1. For this reason, after the time TSS elapses since the assertion of the PWM signal generation start signal, the lower-limit detection signal rises. Subsequently, the lower-limit detection signal remains at a high level. On the other hand, the output voltage does not exceed the target upper-limit value VREF2 and therefore the upper-limit detection signal remains at a low level.

A second timing chart shown in FIG. 14 shows a timing chart where an overshoot of the output voltage is occurring. In an example shown in FIG. 14, the PWM signal generation start signal is asserted; time TSS elapses; and subsequently the output voltage exceeds the target lower-limit value VREF1. For this reason, after the time TSS elapses since the assertion of the PWM signal generation start signal, the lower-limit detection signal rises. Subsequently, the lower-limit detection signal remains at a high level. On the other hand, the upper-limit detection signal stays at a high level during a period corresponding to the period during which the output voltage exceeds the target upper-limit value VREF2.

A third timing chart shown in FIG. 15 shows a timing chart where an undershoot of the output voltage is occurring. In an example shown in FIG. 15, the PWM signal generation start signal is asserted; time TSS elapses; and subsequently the output voltage exceeds the target lower-limit value VREF1. For this reason, after the time TSS elapses since the assertion of the PWM signal generation start signal, the lower-limit detection signal rises. Subsequently, the output voltage falls below the target lower-limit value. For this reason, the lower-limit detection signal stays at a low level during a period corresponding to the period during which the output voltage falls below the target lower-limit value. When the output voltage exceeds the target lower-limit value VREF1 again, the lower-limit detection signal is set to a high level. Since the output voltage does not exceed the target upper-limit value VREF2, the upper-limit detection signal remains at a low level.

As shown in FIGS. 13 to 15, in the output monitor unit 40, the logic levels of lower-limit and upper-limit detection signals vary according to variations in output voltage. The output monitor unit 40 records time-series changes in output voltage by accumulating the logic levels of lower-limit and upper-limit detection signals in the time-series information storage register in a time-series manner. By referring to the time-series information of the measured values, the computing core PE can determine whether the variations in output voltage are appropriate, as well as which of the parameter setting values should be changed.

Figure 16:
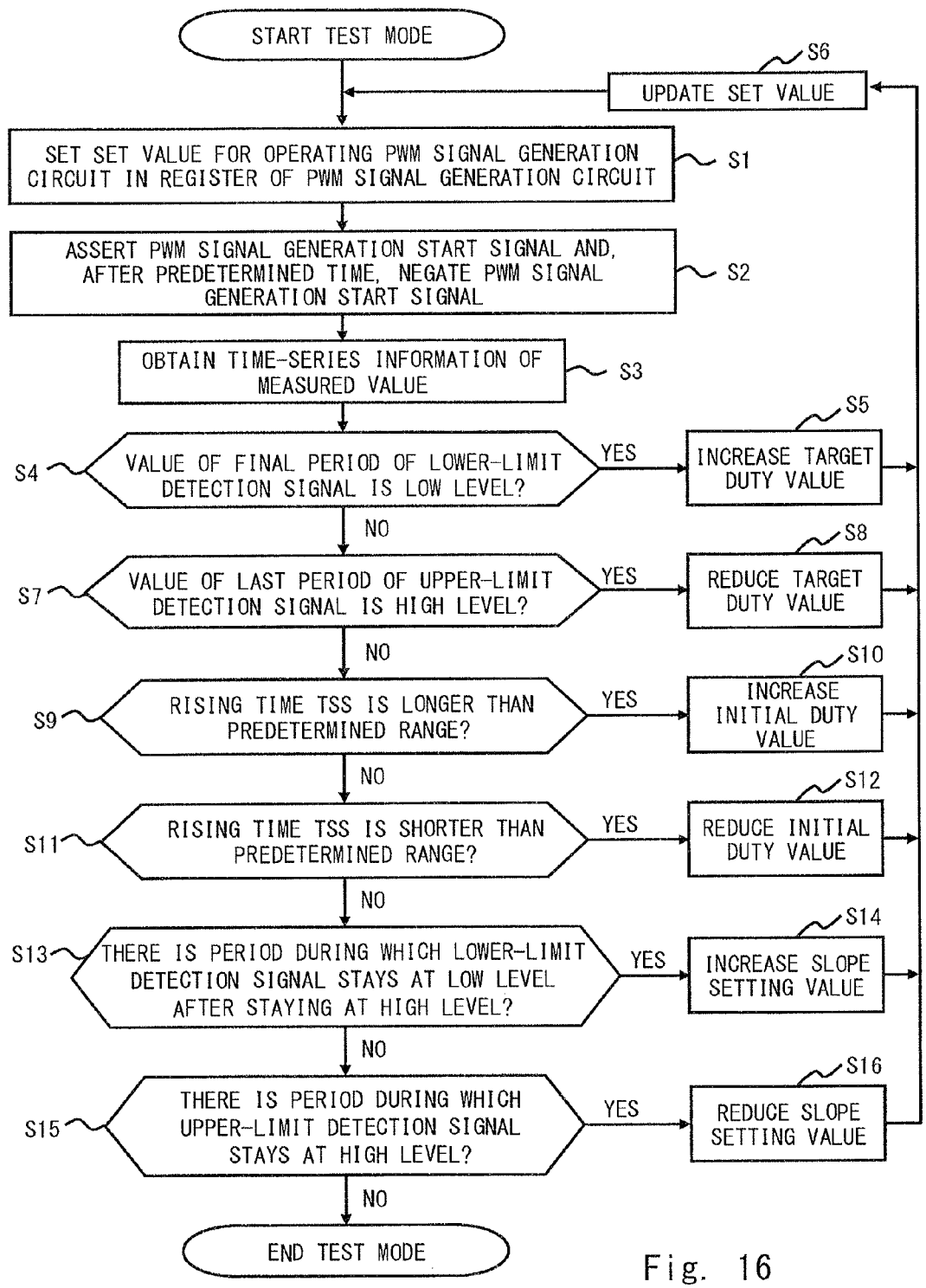
FIG. 16 is a flowchart showing the setup steps of a setting value of a soft start according to the second embodiment.

Hereafter, a set value adjustment process performed by the computing core will be described. FIG. 16 shows a flowchart showing the steps of an adjustment method according to the second embodiment. The computing core PE performs the process along the flowchart shown in FIG. 16. In an example shown in FIG. 16, the computing core PE adjusts the setting values during a test mode period. As for the timing, adjustment of the setting values may be performed, for example, as part of the process of starting the processor system MCU, or may always be performed.

As shown in FIG. 16, when test mode is started, the computing core PE reads the setting values for operating the PWM signal generation circuit 2 (e.g., initial duty value, etc.) from the memory MEM and stores the read values in the register of the PWM signal generation circuit 2 (step S1).

Subsequently, the computing core PE asserts the PWM signal generation start signal and, after predetermined time, negates it (step S2). Thus, the PWM signal generation circuit 2 generates PWM signals for the predetermined time. The output monitor unit 40 generates time-series information of measured values obtained by measuring the output voltages, in the time-series information storage register 41. The computing core PE then obtains the time-series information from the time-series information storage register 41 (step S3).

The computing core PE then refers to a value corresponding to the last period in the time-series information obtained to determine whether the value of the last period of the lower-limit detection signal is a low level (step S4). If the value of the last period of the lower-limit detection signal is a low level in step S4, the computing core PE increases the target duty value (step S5). The computing core PE then updates the target duty value stored in the memory MEM using the target duty value increased (step S6). The computing core PE then performs the processes of step S1 to S3 again.

If the value of the last period of the lower-limit detection signal is a low level in step S4, the computing core PE determines whether the value of the last period of the upper-limit detection signal is a high level (step S7). If the value of the last period of the upper-limit detection signal is a high level in step S7, the computing core PE reduces the target duty value (step S8). The computing core PE then updates the target duty value stored in the memory MEM using the target duty value reduced (step S6). The computing core PE then performs the processes of step S1 to S3 again.

If the value of the last period of the upper-limit detection signal is a low level in step S7, the computing core PE determines whether the rising time TSS is longer than a predetermined range (step S9). If the rising time TSS is longer than the predetermined range in step S9, the computing core PE increases the initial duty value (step S10). The computing core PE then updates the initial duty value stored in the memory MEM using the initial duty value increased (step S6). The computing core PE then performs the processes of step S1 to S3 again.

If the rising time TSS is not longer than the predetermined range in step S9, the computing core PE determines whether the rising time TSS is shorter than the predetermined range (step S11). If the rising time TSS is shorter than the predetermined range in step S11, the computing core PE reduces the initial duty value (step S12). The computing core PE then updates the initial duty value stored in the memory MEM using the initial duty value reduced (step S6). The computing core PE then performs the processes of step S1 to S3 again.

If the rising time TSS is not shorter than the predetermined range in step S11, the computing core PE determines whether there is a period during which the lower-limit detection signal stays at a low level after staying at a high level (step S13). If there is a period during which the lower-limit detection signal stays at a low level after staying at a high level, in step S13, the computing core PE increases the slope setting value (step S14) The computing core PE then updates the slope setting value stored in the memory MEM using the slope setting value increased (step S6). The computing core PE then performs the processes of step S1 to S3 again.

If there is no period during the lower-limit detection signal stays at a low level after staying at a high level, in step S13, the computing core PE determines whether there is a period during which the upper-limit detection signal stays at a high level (step S15). If there is a period during which the upper-limit detection signal stays at a high level, in step S15, the computing core PE reduces the slope setting value (step S16). The computing core PE then updates the slope setting value stored in the memory MEM using the slope setting value reduced (step S6). The computing core PE then performs the processes of step S1 to S3 again.

When the computing core PE passes all of steps S4, S7, S9, S11, S13, and S15, test mode ends. When test mode ends in this way, an output voltage generated by receiving a PWM signal generated by the PWM signal generation circuit 2, which operates on the basis of the setting values adjusted, does not cause an overshoot or undershoot, and the voltage value falls within the range defined by the target lower-limit value VREF1 and the target upper-limit value VREF2. That is, the output voltage has the rising waveform shown in FIG. 13.

As is seen in the above description, the PWM signal generation circuit 2, which operates on the basis of the setting values determined using the adjustment method according to the second embodiment, can generate a PWM signal that causes the circuit to be controlled to operate ideally.

Further, if the processor system MCU capable of performing the adjustment method according to the second embodiment controls a power supply circuit that drives an LED, the life of the LED can be extended. In general, characteristics of an LED change due to aging degradation. For this reason, when the LED is controlled on the basis of a PWM signal generated on the basis of the fixed setting values, it suffers degradation, such as a reduction in luminance. However, by generating a PWM signal for driving the LED while performing the adjustment method according to the second embodiment as appropriate, it is possible to generate an output voltage which compensates for the degradation of characteristics of the LED. By generating an output voltage which compensates for the degradation of characteristics of the LED, it is possible to substantially extend the life of the LED.

The setting values updated using the set value adjustment method according to the second embodiment are stored in the memory MEM. Thus, by reading the setting values from the memory MEM when restarted, the processor system MCU can cause the PWM signal generation circuit 2 to start operating in an optimized state, using the optimized setting values, without having to adjust the setting values.

Third Embodiment

Figure 17:
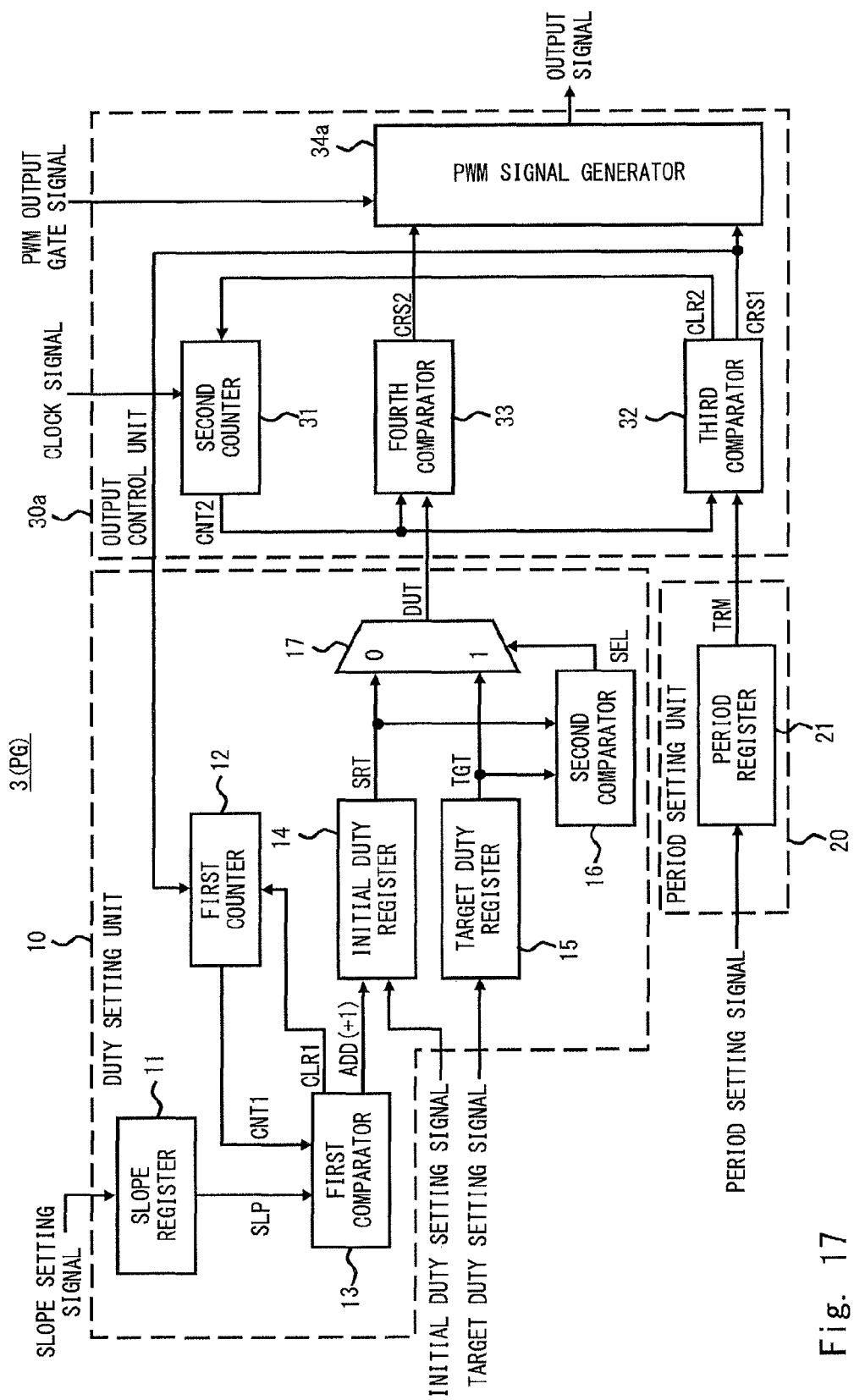
FIG. 17 is a block diagram of a PWM signal generation circuit according to a third embodiment.

FIG. 17 shows a block diagram of a PWM signal generation circuit 3 according to a third embodiment. As shown in FIG. 17, the PWM signal generation circuit 3 according to the third embodiment uses a PWM signal generator 34a in place of the PWM signal generator 34 of the PWM signal generation circuit 1 according to the first embodiment. In FIG. 17, an output control unit including the PWM signal generator 34a is given reference sign 30a.

The PWM signal generator 34a receives the period setting signal CRS1 and the switching signal CRS2, as well as a PWM output gate signal. When the PWM output gate signal is asserted, the PWM signal generator 34a performs the same operation as the PWM signal generator 34. In contrast, when the PWM output gate signal is negated, the PWM signal generator 34a stops generating a PWM signal.

The PWM output gate signal is selectively asserted or negated by the computing core PE. At the point in time when the PWM output gate signal is asserted, the computing core PE sets, based on the setting values read from the memory MEM, a slope setting value to be stored in the slope register 11 of the PWM signal generation circuit 3, an initial duty value to be stored in the initial duty register 14 thereof, a target duty value to be stored in the target duty register 15 thereof, and a period setting value to be stored in the period register 21 thereof.

Figure 18:
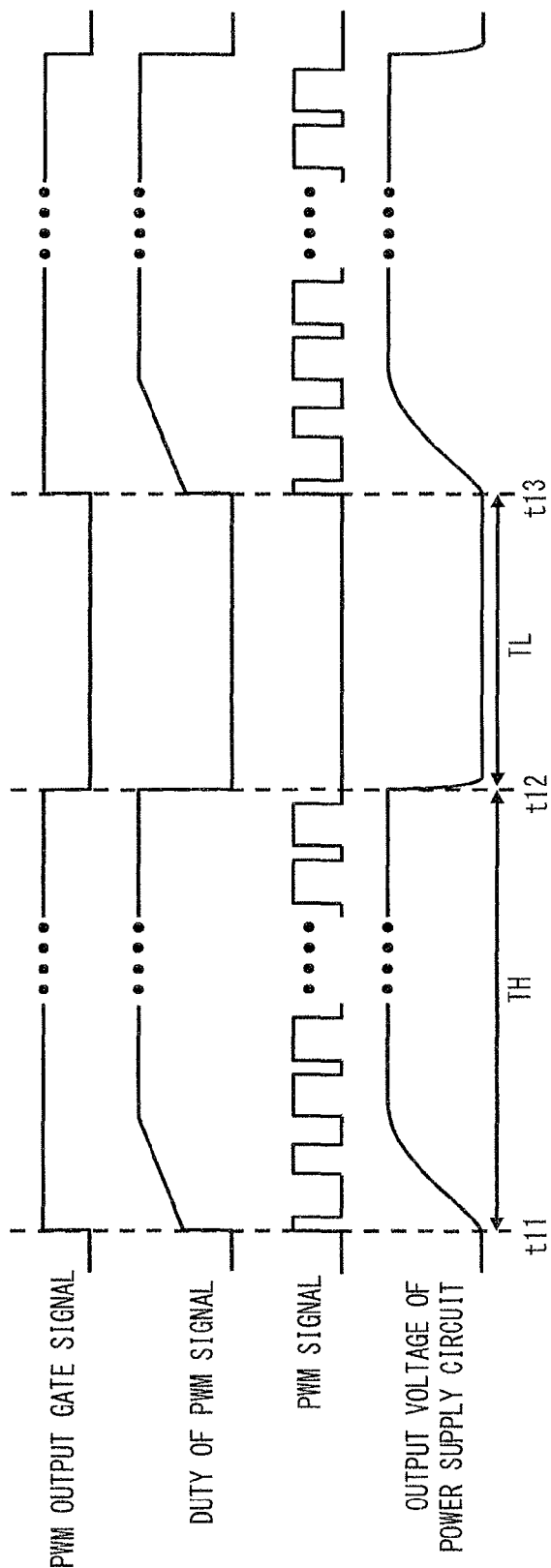
FIG. 18 is a timing chart showing a PWM signal that generated by the PWM signal generation circuit and an output voltage which a power supply circuit generates based on the PWM signal according to the third embodiment.

Next, an operation of the PWM signal generation circuit 3 according to the third embodiment will be described. FIG. 18 shows a timing chart showing an operation of the PWM signal generation circuit 3 according to the third embodiment. As shown in FIG. 18, the PWM signal generation circuit 3 according to the third embodiment starts generating a PWM signal when a PWM output gate signal is asserted at timing t11. At this time, the PWM signal is generated while being soft-start controlled. An output voltage of the power supply circuit generated on the basis of the PWM signal soft-start controlled rises without causing an overshoot or undershoot.

Subsequently, when the PWM output gate signal is negated at timing t12, the PWM signal generation circuit 3 stops outputting a PWM signal, reducing the output voltage of the power supply circuit.

Subsequently, when the PWM output gate signal is asserted again at timing t13, the PWM signal generation circuit 3 generates a PWM signal while soft-start controlling it. Subsequently, the output voltage of the power supply circuit rises on the basis of the PWM signal generated.

As shown in FIG. 18, the PWM signal generation circuit 3 intermittently asserts a PWM output gate signal, thereby intermittently generating a PWM signal. The intermittent interval can be determined based on the ratio between the assertion period TH and negation period TL of the PWM output gate signal. Further, each time the PWM signal generation circuit 3 restarts generating a PWM signal, it generates the PWM signal using soft-start control.

If the load circuit driven by the power supply circuit is an LED, controlling the ratio between the assertion period TH and negation period TL of the PWM output gate signal allows dimming to be performed on the LED. This is because the luminance of the LED can be controlled using the integrated value of the time during which the LED lights up.

As seen in the above description, use of the PWM signal generation circuit 3 according to the third embodiment allows dimming control of the LED. Each time it asserts a PWM output gate signal, the PWM signal generation circuit 3 according to the third embodiment generates a PWM signal using soft-start control. Thus, the output signal of the power supply circuit rises without causing an overshoot or undershoot at any rising timing. Execution of such control can prevent application of overcurrent to the LED and the resulting degradation of the LED.

Further, it is possible to receive a control signal (e.g., dimming control signal) from an external circuit via the IO unit IOU of the processor system MCU and to control the ratio between the assertion period TH and negation period TL of the PWM output gate signal using the computing core PE on the basis of the dimming control signal received. Owing to such a configuration, the processor system MCU including the PWM signal generation circuit 3 according to the third embodiment can perform dimming on the LED on the basis of an instruction from the outside.

Fourth Embodiment

Figure 19:
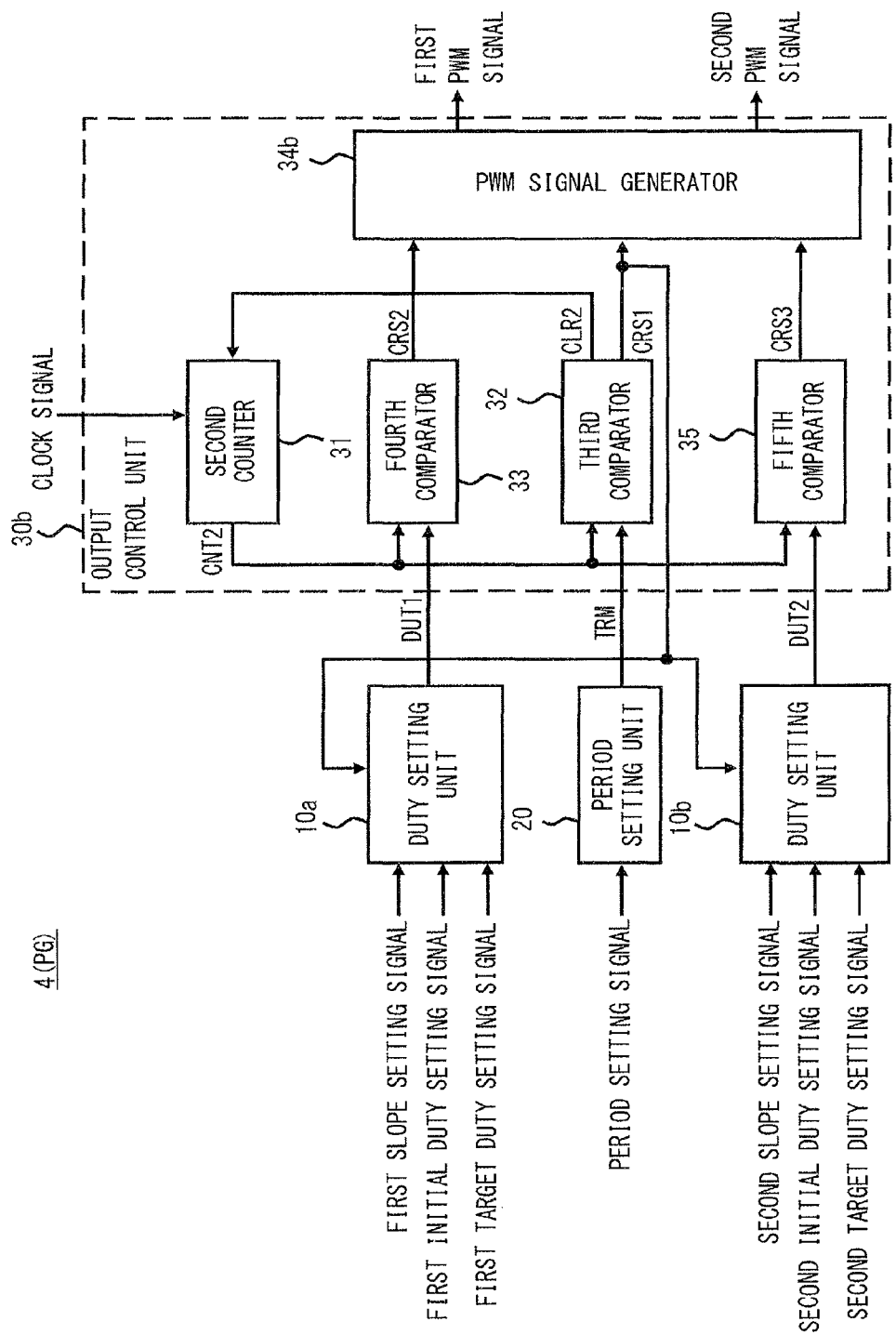
FIG. 19 is a block diagram of a PWM signal generation circuit according to a fourth embodiment.

FIG. 19 shows a block diagram of a PWM signal generation circuit 4 according to a fourth embodiment. As shown in FIG. 19, the PWM signal generation circuit 4 includes duty setting units 10a and 10b, the period setting unit 20, and an output control unit 30b. The period setting unit 20 is the same as that according to the first embodiment and therefore will not be described.

While the duty setting units 10a and 10b have the same configuration as the duty setting unit 10 according to the first embodiment, they receive mutually independent setting signals. In an example shown in FIG. 19, the duty setting circuit 10a receives a first slope setting signal, a first initial duty setting signal, and a first target duty setting signal. The duty setting circuit 10b receives a second slope setting signal, a second initial duty setting signal, and a second target duty setting signal. Based on the setting signals having mutually independent values, the duty setting units 10a and 10b output duty control signals DUT1 and DUT2, respectively, which have mutually independent values.

The output control unit 30b is formed by adding a fifth comparator 35 to the output control unit 30 according to the first embodiment and including a PWM signal generator 34b in place of the PWM signal generator 34. In response to the second count value CNT2 reaching a value indicating a duty ratio indicated by the duty control signal DUT2, the fifth comparator 35 outputs a switching signal CRS3 providing an instruction to switch the logic level of a PWM signal. While the fourth comparator 33 corresponds to the fourth comparator 33 according to the first embodiment, it receives the duty control signal DUT1 as a signal corresponding to the duty control signal DUT.

The PWM signal generator 34b sets the logic level of a first PWM signal to the initial logic level in accordance with the period start signal CRS1; it sets the logic level of the PWM signal to the end logic level, which is a logic level opposite to the initial logic level, in accordance with the switching signal CRS2. Further, the PWM signal generator 34b sets the logic level of the second PWM signal to the initial logic level in accordance with the period start signal CRS1; it sets the logic level of the PWM signal to the end logic level, which is a logic level opposite to the initial logic level, in accordance with a switching signal CRS3. In the present embodiment, the logic level at the start of one period (initial logic level) of a PWM signal to be outputted is set to 1; the logic level at the end of one period (end logic level) of the PWM signal is set to 0.

That is, the output control unit 30b generates multiple PWM signals having duty ratios corresponding to the values of duty ratios indicated by the duty control signals outputted by the multiple duty setting units.

Owing to the above configuration, the PWM signal generation circuit 4 according to the fourth embodiment generates the first and second PWM signals having the same period and mutually independent duty ratios. The operation of the PWM signal generation circuit 4 will not be described, since the number of signals to be outputted is simply increased to two and the substantial operation thereof is the same as that of the PWM signal generation circuit 1 according to the first embodiment.

As seen in the above description, the PWM signal generation circuit 4 according to the fourth embodiment can independently perform setting of the duty ratios and setting of soft-start control of the PWM signals. While the number of PWM signals to be outputted is two in the above description, three PWM signals may be generated by applying the same rule under which the PWM signal generation circuit 1 is changed to the PWM signal generation circuit 4. LED-using lighting systems may use LEDs corresponding to three colors in recent years. In such a case, characteristics may vary among the LEDs. However, use of the PWM signal generation circuit 4 allows characteristics of multiple PWM signals to be set independently. Accordingly, by using the PWM signal generation circuit 4, it is possible to compensate for variations among the LEDs used as a set of light-emitting devices and thus to make characteristics of the LEDs uniform.

Further, the method for adjusting the setting values of the PWM signal generation circuit according to the second embodiment may be applied to the PWM signal generation circuit 4 according to the fourth embodiment. Further, the PWM signal intermittent output function of the PWM signal generation circuit 3 according to the fourth embodiment may be added to the PWM signal generation circuit 4 according to the fourth embodiment. In particular, by adding the PWM signal intermittent output function of the PWM signal generation circuit 3, it is possible to adjust each luminance of the three LEDs and thus to perform dimming as well as toning on the LEDs.

The present invention is not limited to the above embodiments, and changes can be made to the embodiments as appropriate without departing from the spirit and scope of the invention. For example, the order in which the parameters are set in the method for adjusting setting values according to the second embodiment may be changed according to the specification, as appropriate.

The present application claims priority based on Japanese Unexamined Patent Application No. 2011-070437, filed on Mar. 28, 2011, the disclosure of which is incorporated herein in its entirety.

REFERENCE SIGNS LIST 1 to 4 PWM signal generation circuit
10, 10a, 10b duty setting unit
11 slope register
12, 12a, 31, 31a counter
13, 16, 32, 33, 35 comparator
14 initial duty register
15 target duty register
17 selection circuit
20 period setting unit
21 period register
30, 30a, 30b output control unit
34, 34a, 34b signal generator
40, 50 output monitor unit
41, 52 time-series information storage register 51 A/D converter
C capacitor
L inductor
Di diode
R resistor
OM transistor
MCU processor system
MEM memory
MON output monitor unit
PE computing core
PERI peripheral circuit
PG PWM signal generation unit
CG clock generation unit

The invention claimed is:

1. A PWM signal generator circuit, comprising:
a duty rate information; and
a PWM signal generation unit,
wherein the PWM signal generation unit generates a PWM signal having gradually increasing duty ratio in a predetermined period,
wherein the predetermined period includes a first period and a second period which is successive to the first period and has the same time length as the first period, and
wherein a difference between a first duty ratio of the PWM signal generated in the first period and a second duty ratio of the PWM signal generated in the second period is determined by the duty rate information.

2. The PWM signal generator circuit according to claim 1, further comprising:
an initial duty information,
wherein the first duty ratio is determined by the initial duty information.

3. The PWM signal generator circuit according to claim 1, wherein the predetermined period further includes a third period which is successive to the second period and has the same time length as the second period,
wherein a difference between the second duty ratio and a third duty ratio of the PWM signal generated in the third period is determined by the duty rate information.

4. The PWM signal generator circuit according to claim 1, wherein the first period is longer than a period of the PWM signal.

5. The PWM signal generator circuit according to claim 4, wherein the PWM signal generated in the first period includes a plurality of pulses.

6. The PWM signal generator circuit according to claim 1, wherein the PWM signal generated in the first period includes two pulses which have both the first duty ratios and the PWM signal generated in the second period includes two pulses which have both the second duty ratios.

7. The PWM signal generator circuit according to claim 3, wherein the PWM signal generated in the third period includes two pulses which have both the third duty ratios.

8. A PWM signal generator circuit, comprising:
a duty rate information; and
a PWM signal generation unit,
wherein the PWM signal generation unit generates a PWM signal having gradually increasing pulse width in a predetermined period,
wherein the predetermined period includes a first period and a second period which is successive to the first period and has the same time length as the first period, and
wherein a difference between a first pulse width of the PWM signal generated in the first period and a second pulse width of the PWM signal generated in the second period is determined by the duty rate information.

9. The PWM signal generator circuit according to claim 8, further comprising:
an initial duty information,
wherein the first pulse width is determined by the initial duty information.

10. The PWM signal generator circuit according to claim 8, wherein the predetermined period further includes a third period which is successive to the second period and has the same time length as the second period,
wherein a difference between the second pulse width and a third pulse width of the PWM signal generated in the third period is determined by the duty rate information.

11. The PWM signal generator circuit according to claim 8, wherein the first period is longer than a period of the PWM signal.

12. The PWM signal generator circuit according to claim 11, wherein the PWM signal generated in the first period includes a plurality of pulses.

13. The PWM signal generator circuit according to claim 8, wherein the PWM signal generated in the first period includes two pulses which have both the first pulse widths and the PWM signal generated in the second period includes two pulses which have both the second pulse widths.

14. The PWM signal generator circuit according to claim 10, wherein the PWM signal generated in the third period includes two pulses which have both the third pulse widths.

15. The PWM signal generator circuit according to claim 13, the first pulse width is a time length of high level of the pulse generated in the first period and the second pulse width is a time length of high level of the pulse generated in the second period.

16. The PWM signal generator circuit according to claim 14, the third pulse width is a time length of high level of the pulse generated in the third period.

17. A PWM signal generator circuit, comprising:
a duty rate information; and
a PWM signal generation unit, wherein the PWM signal generation unit generates a PWM signal having gradually increasing pulse widths,
wherein the PWM signal generation unit increases the pulse widths based on the duty rate information each time one of a plurality of first periods elapses, and
wherein, within each one of the plurality of first periods, the PWM signal includes a plurality of pulses having the same pulse width.

18. The PWM signal generator circuit according to claim 17, wherein each of the pulse widths is a time length of high level of the pulse generated in the first period.

19. The PWM signal generator circuit according to claim 17, wherein the first period is longer than a period of the PWM signal.

20. The PWM signal generator circuit according to claim 17, wherein the plurality of pulses of the PWM signal in one of the plurality of first periods has a first pulse width and the plurality of pulses of the PWM signal in another of the plurality of first periods has a second pulse width different from the first pulse width.

21. A PWM signal generator circuit, comprising:
a memory, which stores a duty rate information; and
a processor configured to generate a PWM signal having gradually increasing pulse widths,
wherein the processor increases the pulse widths based on the duty rate information each time one of a plurality of first periods elapses, and wherein, within each one of the plurality of first periods, the PWM signal includes a plurality of pulses having the same pulse width.

* * * * *